(12) United States Patent
Takeuchi et al.

(10) Patent No.: US 10,923,064 B2
(45) Date of Patent: Feb. 16, 2021

(54) SCANNING SIGNAL LINE DRIVE CIRCUIT AND DISPLAY DEVICE EQUIPPED WITH SAME

(71) Applicant: Sharp Kabushiki Kaisha, Sakai (JP)

(72) Inventors: Yohei Takeuchi, Sakai (JP); Takuya Watanabe, Sakai (JP); Yasuaki Iwase, Sakai (JP); Akira Tagawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/500,427

(22) PCT Filed: Apr. 10, 2018

(86) PCT No.: PCT/JP2018/015056
§ 371 (c)(1),
(2) Date: Oct. 3, 2019

(87) PCT Pub. No.: WO2018/193912
PCT Pub. Date: Oct. 25, 2018

(65) Prior Publication Data
US 2020/0126502 A1    Apr. 23, 2020

(30) Foreign Application Priority Data
Apr. 17, 2017  (JP) .................................. 2017-081030

(51) Int. Cl.
*G09G 3/36* (2006.01)
*G11C 19/18* (2006.01)
*G11C 19/28* (2006.01)

(52) U.S. Cl.
CPC ......... *G09G 3/3677* (2013.01); *G11C 19/186* (2013.01); *G11C 19/28* (2013.01); *G09G 2310/0286* (2013.01)

(58) Field of Classification Search
CPC ..... G09G 3/3677; G11C 19/186; G11C 19/28
(Continued)

(56) References Cited

U.S. PATENT DOCUMENTS 5,416,747 A * 5/1995 Ohira ....................... G11C 8/08
                                                          365/189.09
2002/0175887 A1* 11/2002 Yamazaki ............... G09G 3/36
                                                             345/87
(Continued)

FOREIGN PATENT DOCUMENTS

WO      2011/080936 A1    7/2011
WO      2014/061231 A1    4/2014

OTHER PUBLICATIONS

Official Communication issued in International Patent Application No. PCT/JP2018/015056, dated Jul. 17, 2018.

*Primary Examiner* — Prabodh M Dharia
(74) *Attorney, Agent, or Firm* — Keating & Bennett, LLP

(57) ABSTRACT

A gate driver (scanning signal line drive circuit) that can allow a gate output to promptly fall without causing a deterioration in a transistor is implemented. A gate-output fall transistor (T01) and a gate-output stabilization transistor (T02) are provided near an output portion of the unit circuit that constitutes a shift register. A first gate low voltage (Vgl1) having a voltage level that is conventionally used to bring pixel TFTs into an off state is provided to a source terminal of the gate-output stabilization transistor (T02), and a second gate low voltage (Vgl2) having a lower voltage level than the first gate low voltage (Vgl1) is provided to a source terminal of the gate-output fall transistor (T01). Upon allowing the gate output to fall, the gate-output fall transistor (T01) is brought into an on state and then the gate-output stabilization transistor (T02) is brought into an on state.

10 Claims, 20 Drawing Sheets

(58) Field of Classification Search
USPC ...................... 345/87, 100, 208, 211; 377/64
See application file for complete search history.

(56) References Cited

U.S. PATENT DOCUMENTS

| | | | |
|---|---|---|---|
| 2006/0022201 A1* | 2/2006 | Kim | H01L 29/78669 257/72 |
| 2008/0101529 A1* | 5/2008 | Tobita | G11C 19/28 377/64 |
| 2010/0039358 A1* | 2/2010 | Lin | G09G 3/3611 345/84 |
| 2011/0199354 A1* | 8/2011 | Iwase | G09G 3/3677 345/208 |
| 2012/0146969 A1* | 6/2012 | Sakamoto | G02F 1/13454 345/204 |
| 2012/0242630 A1 | 9/2012 | Ohara | |
| 2013/0038590 A1* | 2/2013 | Yamada | G09G 3/3655 345/211 |
| 2015/0269900 A1* | 9/2015 | Iwamoto | G09G 3/3688 345/100 |
| 2015/0279272 A1 | 10/2015 | Takahara | |
| 2016/0372068 A1* | 12/2016 | Yamamoto | G11C 19/28 |
| 2017/0160862 A1* | 6/2017 | Suzuki | G06F 3/0446 |
| 2017/0162101 A1* | 6/2017 | Ohara | G09G 3/2018 |
| 2017/0186373 A1* | 6/2017 | Nishikawa | G09G 3/3258 |
| 2017/0323612 A1* | 11/2017 | Yamamoto | G11C 19/00 |
| 2018/0308444 A1* | 10/2018 | Sueki | G11C 19/28 |

\* cited by examiner

SCANNING SIGNAL LINE DRIVE CIRCUIT AND DISPLAY DEVICE EQUIPPED WITH SAME

TECHNICAL FIELD

The following disclosure relates to a display device, and more specifically to a scanning signal line drive circuit for driving gate bus lines (scanning signal lines) arranged in a display unit of a display device.

BACKGROUND ART

Conventionally, there is known a liquid crystal display device including a display unit including a plurality of source bus lines (video signal lines) and a plurality of gate bus lines (scanning signal lines). In such a liquid crystal display device, pixel formation portions that form pixels are provided at intersections of the source bus lines and the gate bus lines. Each pixel formation portion includes a thin-film transistor (pixel TFT) which is a switching element connected at its gate terminal to a gate bus line passing through a corresponding intersection and connected at its source terminal to a source bus line passing through the intersection, a pixel capacitance for holding a pixel voltage value, etc. The liquid crystal display device is also provided with a gate driver (scanning signal line drive circuit) for driving the gate bus lines, and a source driver (video signal line drive circuit) for driving the source bus lines.

A video signal indicating a pixel voltage value is transmitted by a source bus line. However, each source bus line cannot transmit video signals indicating pixel voltage values for a plurality of rows, at one time (simultaneously). Due to this, writing (charging) of video signals to the pixel capacitances in the plurality of pixel formation portions provided in the display unit is sequentially performed row by row. Hence, in order to sequentially select the plurality of gate bus lines for a predetermined period, the gate driver is composed of a shift register including a plurality of stages. By sequentially outputting active scanning signals (scanning signals with a voltage level that brings the pixel TFTs into an on state) from the respective stages of the shift register, writing of video signals to the pixel capacitances is sequentially performed row by row as described above. Note that in this specification a circuit that forms each stage of the shift register is referred to as "unit circuit".

Meanwhile, conventionally, the gate driver is often mounted as an integrated circuit (IC) chip in a portion around a substrate that constitutes a liquid crystal panel. However, in recent years, forming the gate driver directly on the substrate has gradually increased. Such a gate driver is called a "monolithic gate driver", etc.

Regarding the monolithic gate driver, each stage (each unit circuit) of the shift register is provided with a transistor (hereinafter, referred to as "gate-output fall transistor") for allowing a gate output (a voltage of a scanning signal outputted from the gate driver) to fall. In general, the gate-output fall transistor has a gate terminal to which a reset signal is provided, a drain terminal connected to a gate bus line, and a source terminal to which a gate low voltage which is a low-level direct-current power supply voltage is provided. The gate low voltage has a voltage level that brings the pixel TFTs into an off state (in other words, a voltage level that brings the gate bus lines into a non-selected state). In a configuration such as that described above, upon allowing the gate output to fall, the reset signal goes to a high level, and the gate-output fall transistor goes into an on state. By this, the scanning signal changes from a high level to a low level. Note that although here description is made based on the premise that n-channel transistors are used, in a case in which p-channel transistors are used, a transistor for allowing a gate output to rise is provided in each stage of the shift register.

As described above, in the monolithic gate driver, the gate output is allowed to fall using the gate-output fall transistor, but as shown in a portion indicated by an arrow given reference character 90 in FIG. 22, rounding occurs in a waveform of the gate output depending on the size of a gate load, etc. If switching of a source voltage (a voltage of a video signal) is performed before the gate output sufficiently falls, then writing of a desired pixel voltage value to the pixel capacitance is not performed. Hence, switching of a source voltage is performed after the gate output has sufficiently fallen. Note that in FIG. 22 a voltage level (of a scanning signal) that securely brings the pixel TFTs into an on state is represented by Vgh, and a voltage level (of a scanning signal) that securely brings the pixel TFTs into an off state is represented by Vgl. Meanwhile, an improvement in the definition of a panel has been proceeding in recent years. When the definition of the panel improves, the length of one horizontal scanning period becomes short. At this time, if the time required to allow the gate output to fall (hereinafter, referred to as "gate-output fall time") (time indicated by an arrow given reference character 91 in FIG. 22) is long, then sufficient charging time for the pixel capacitance cannot be secured. As such, the degree of an implementable improvement in definition depends on the gate-output fall time.

In view of this, International Publication No. 2011/080936 pamphlet discloses a shift register that achieves a reduction in gate-output fall time by enhancing the drive capability of a gate-output fall transistor by providing a high voltage to a gate terminal of the gate-output fall transistor.

PRIOR ART DOCUMENT

Patent Document

[Patent Document 1] International Publication No. 2011/080936 pamphlet

SUMMARY OF THE INVENTION

Problems to be Solved by the Invention

However, according to a technique disclosed in International Publication No. 2011/080936 pamphlet, since a high voltage is applied to the gate terminal of the gate-output fall transistor, the gate-output fall transistor significantly deteriorates. Hence, an effect of the reduction in gate-output fall time by the technique does not last for a long period of time.

An object of the following disclosure is therefore to implement a gate driver (scanning signal line drive circuit) capable of allowing a gate output to promptly fall without causing a deterioration in a transistor.

Means for Solving the Problems

A scanning signal line drive circuit of some embodiments includes a shift register including a plurality of unit circuits configured to operate based on a plurality of clock signals, and drives a plurality of scanning signal lines arranged in a display unit of a display device. At least a first non-selection level voltage and a second non-selection level voltage are provided to each unit circuit, as a non-selection level voltage having a voltage level that brings the scanning signal lines into a non-selected state. Each unit circuit includes a first output node, a first-output-node stabilization transistor, and a non-selection control transistor. The first output node outputs a first output signal to be provided to a corresponding scanning signal line. The first-output-node stabilization transistor has a control terminal, a first conduction terminal connected to the first output node, and a second conduction terminal to which the first non-selection level voltage is provided. The non-selection control transistor has a control terminal, a first conduction terminal connected to the first output node, and a second conduction terminal to which the second non-selection level voltage is provided. The plurality of unit circuits sequentially output, as the first output signals, selection level voltages having a voltage level that brings the scanning signal lines into a selected state, from the first output nodes. A difference in voltage level between the selection level voltage and the second non-selection level voltage is larger than a difference in voltage level between the selection level voltage and the first non-selection level voltage, and in each unit circuit, upon changing a corresponding scanning signal line from a selected state to a non-selected state, the non-selection control transistor is brought into an on state and then the first-output-node stabilization transistor is brought into an on state.

Effects of the Invention

In a case in which n-channel transistors are used as transistors in the unit circuits constituting the shift register, upon allowing a gate output (a voltage of a scanning signal (first output signal) outputted from the scanning signal line drive circuit) to fall, the voltage of the scanning signal is temporarily drawn to a lower level than a conventional non-selection level. In addition, in a case in which p-channel transistors are used as transistors in the unit circuits constituting the shift register, upon allowing a gate output to rise, the voltage of the scanning signal is temporarily increased to a higher level than the conventional non-selection level. By the above, the change rate of the voltage of the scanning signal becomes higher than a conventional one, and the time required for the gate output to change from an on level to an off level becomes shorter than a conventional one. In addition, a significant deterioration in the non-selection control transistor does not occur. By the above, a scanning signal line drive circuit capable of allowing a gate output to promptly change from an on level to an off level without causing a deterioration in a transistor is implemented. By this, the length of one horizontal scanning period can be made shorter than a conventional one, enabling to achieve the improvement in definition and increase in size regarding a panel.

MODES FOR CARRYING OUT THE INVENTION

<0. Preface>

Figure 1:
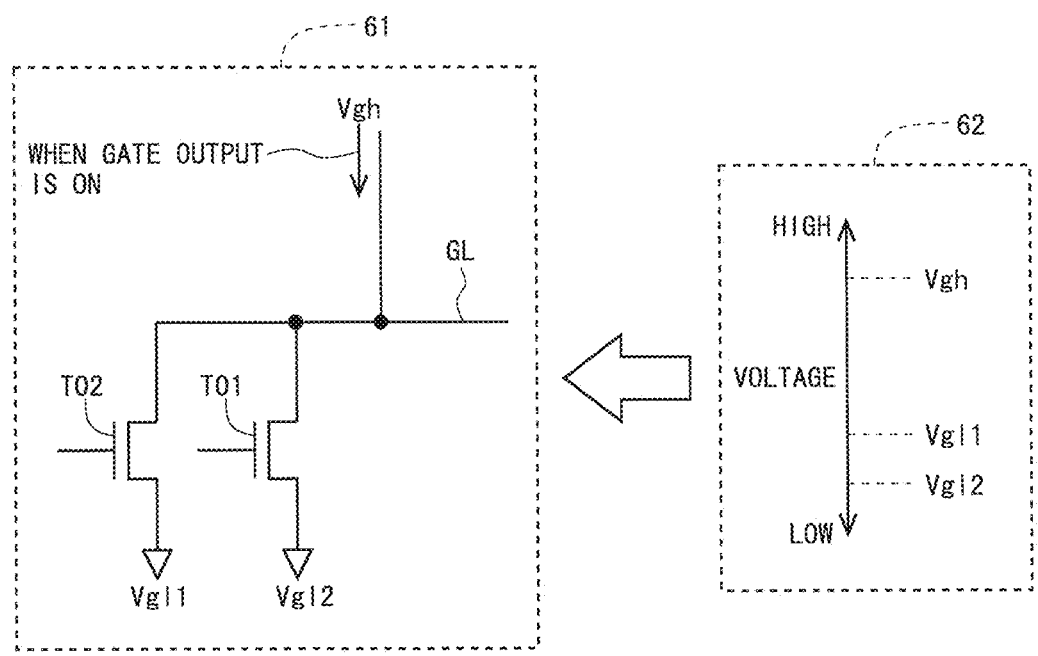
FIG. 1 is a diagram for describing a feature common to all embodiments.

Prior to describing embodiments, matters that are common to all embodiments (including variants) will be described with reference to FIG. 1. In FIG. 1, a configuration of a portion near an output portion of one unit circuit which is included in a shift register composing a gate driver is shown in a dashed-line box given reference character 61. In the portion near the output portion of the unit circuit, there are provided the above-described gate-output fall transistor T01; and a transistor (hereinafter, referred to as "gate-output stabilization transistor") T02 for maintaining a gate output at a low level (off level) during a normal operating period (a period other than a period during which writing to pixel capacitances is performed by bringing a gate bus line GL into a selected state). Both the gate-output fall transistor T01 and the gate-output stabilization transistor T02 are connected at their drain terminals to a corresponding gate bus line GL. In addition, as a low-level direct-current power supply voltage for controlling the operation of the gate driver, there are prepared a first gate low voltage Vgl1 having a voltage level that is conventionally used to bring pixel TFTs into an off state (bring the gate bus lines GL into a non-selected state), and a second gate low voltage Vgl2 having a lower voltage level than the voltage level of the first gate low voltage Vgl1 (see the inside of a dashed-line box given reference character 62 in FIG. 1). The first gate low voltage Vgl1 is provided to a source terminal of the gate-output stabilization transistor T02, and the second gate low voltage Vgl2 is provided to a source terminal of the gate-output fall transistor T01. In such a configuration, upon allowing the gate output to fall, first, the gate-output fall transistor T01 is brought into an on state, and then the gate-output stabilization transistor T02 is brought into an on state. By this, upon allowing the gate output to fall, the voltage of a scanning signal once decreases to the voltage level of the second gate low voltage Vgl2, and then changes to the voltage level of the first gate low voltage Vgl1.

On the basis of the above-described points, embodiments will be described. Note that in the following description, a gate terminal (gate electrode) of a thin-film transistor corresponds to a control terminal, a drain terminal (drain electrode) thereof corresponds to a first conduction terminal, and a source terminal (source electrode) thereof corresponds to a second conduction terminal. In addition, in this regard, in general, one of the drain and source that has a higher potential is called a drain, but in the description of this specification, one is defined as a drain and the other as a source, and thus, a source potential may be higher than a drain potential.

In addition, the voltage level of the first gate low voltage Vgl1 is also referred to as "first low level", and the voltage level of the second gate low voltage Vgl2 is also referred to as "second low level". In addition, in the accompanying drawings (FIG. 8, etc.), the same voltage level as the voltage level of the first gate low voltage is given reference character Vgl1, the same voltage level as the voltage level of the second gate low voltage is given reference character Vgl2, and the same voltage level as the voltage level of a gate high voltage which will be described later is given reference character Vgh.

1. First Embodiment

<1.1 Overall Configuration and Overview of Operation>

Figure 2:
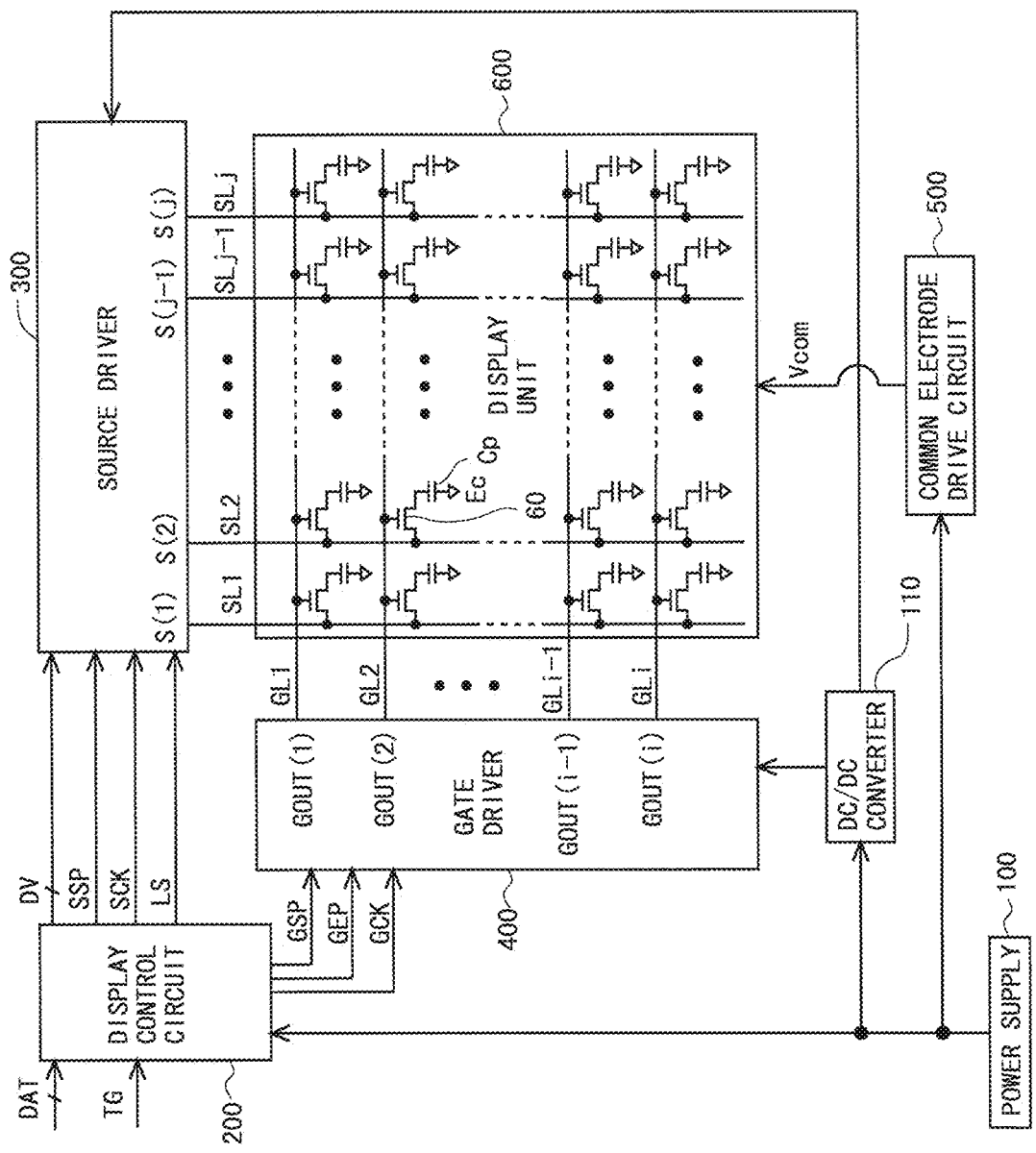
FIG. 2 is a block diagram showing an overall configuration of an active matrix-type liquid crystal display device according to a first embodiment.

FIG. 2 is a block diagram showing an overall configuration of an active matrix-type liquid crystal display device according to a first embodiment. As shown in FIG. 2, the liquid crystal display device includes a power supply 100, a DC/DC converter 110, a display control circuit 200, a source driver (video signal line drive circuit) 300, a gate driver (scanning signal line drive circuit) 400, a common electrode drive circuit 500, and a display unit 600. Note that in the present embodiment the gate driver 400 and the display unit 600 are formed on the same substrate (a TFT substrate which is one of two substrates constituting a liquid crystal panel). That is, the gate driver 400 of the present embodiment is a monolithic gate driver.

In the display unit 600, there are formed a plurality of (j) source bus lines (video signal lines) SL1 to SLj; a plurality of (i) gate bus lines (scanning signal lines) GL1 to GLi; and a plurality of (i×j) pixel formation portions provided at the respective intersections of the plurality of source bus lines SL1 to SLj and the plurality of gate bus lines GL1 to GLi. The plurality of pixel formation portions are arranged in a matrix form, forming a pixel array. Each pixel formation portion includes a thin-film transistor (TFT) 60 which is a switching element connected at its gate terminal to a gate bus line passing through a corresponding intersection and connected at its source terminal to a source bus line passing through the intersection; a pixel electrode connected to a drain terminal of the thin-film transistor 60; a common electrode Ec which is a counter electrode provided to the plurality of pixel formation portions in a shared manner; and a liquid crystal layer provided to the plurality of pixel formation portions in a shared manner and sandwiched between the pixel electrode and the common electrode Ec. By a liquid crystal capacitance formed by the pixel electrode and the common electrode Ec, a pixel capacitance Cp is formed. Note that although normally an auxiliary capacitance is provided in parallel to the liquid crystal capacitance in order to securely hold charge in the pixel capacitance Cp, since the auxiliary capacitance is not directly related to a subject of the present disclosure, the description and depiction thereof are omitted. Note also that in the present embodiment the thin-film transistors 60 are of an n-channel type.

Meanwhile, in the present embodiment, for the thin-film transistors 60 in the display unit 600, a thin-film transistor (IGZO-TFT) having an oxide semiconductor layer including an In—Ga—Zn—O-based semiconductor is adopted. In addition, for thin-film transistors in the gate driver 400 (thin-film transistors included in each unit circuit 4 in a shift register 410 which will be described later), likewise, a thin-film transistor (IGZO-TFT) having an oxide semiconductor layer including an In—Ga—Zn—O-based semiconductor is adopted. Note, however, that for materials of the semiconductor layer of the thin-film transistor, various variations are applicable. For example, it is also possible to adopt a thin-film transistor (a-Si TFT) using amorphous silicon as a semiconductor layer, a thin-film transistor using microcrystalline silicon as a semiconductor layer, a thin-film transistor (oxide TFT) using an oxide semiconductor as a semiconductor layer, a thin-film transistor (LTPS-TFT) using low-temperature polysilicon as a semiconductor layer, etc.

The power supply 100 supplies a predetermined power supply voltage to the DC/DC converter 110, the display control circuit 200, and the common electrode drive circuit 500. The DC/DC converter 110 generates, from the power supply voltage, direct-current voltages for allowing the source driver 300 and the gate driver 400 to operate, and supplies the direct-current voltages to the source driver 300 and the gate driver 400. Note that the direct-current voltages supplied to the gate driver 400 include a high-level direct-current power supply voltage VDD, a first gate low voltage Vgl1, and a second gate low voltage Vgl2. The common electrode drive circuit 500 provides a common electrode drive voltage Vcom to the common electrode Ec.

The display control circuit 200 receives an image signal DAT and a timing signal group TG including a horizontal synchronizing signal, a vertical synchronizing signal, etc., which are transmitted from external sources, and outputs digital video signals DV, and a source start pulse signal SSP, a source clock signal SCK, a latch strobe signal LS, a gate start pulse signal GSP, a gate end pulse signal GEP, and gate clock signals GCK for controlling image display on the display unit 600. Note that in the present embodiment the gate clock signals GCK include eight-phase clock signals with a duty ratio of ½ (i.e., 50%).

The source driver 300 receives the digital video signals DV, the source start pulse signal SSP, the source clock signal SCK, and the latch strobe signal LS which are outputted from the display control circuit 200, and applies driving video signals S(1) to S(j) to the respective source bus lines SL1 to SLj.

The gate driver 400 repeats application of active scanning signals GOUT(1) to GOUT(i) to the respective gate bus lines GL1 to GLi with one vertical scanning period as a cycle, based on the gate start pulse signal GSP, the gate end pulse signal GEP, and the gate clock signals GCK which are outputted from the display control circuit 200. A detailed description of the gate driver 400 will be made later.

By applying the driving video signals S(1) to S(j) to the respective source bus lines SL1 to SLj and applying the scanning signals GOUT(1) to GOUT(i) to the respective gate bus lines GL1 to GLi in the above-described manner, an image based on the image signal DAT transmitted from the external source is displayed on the display unit 600.

<1.2 Gate Driver>
<1.2.1 Overall Configuration and Operation of the Shift Register>

Figure 3:
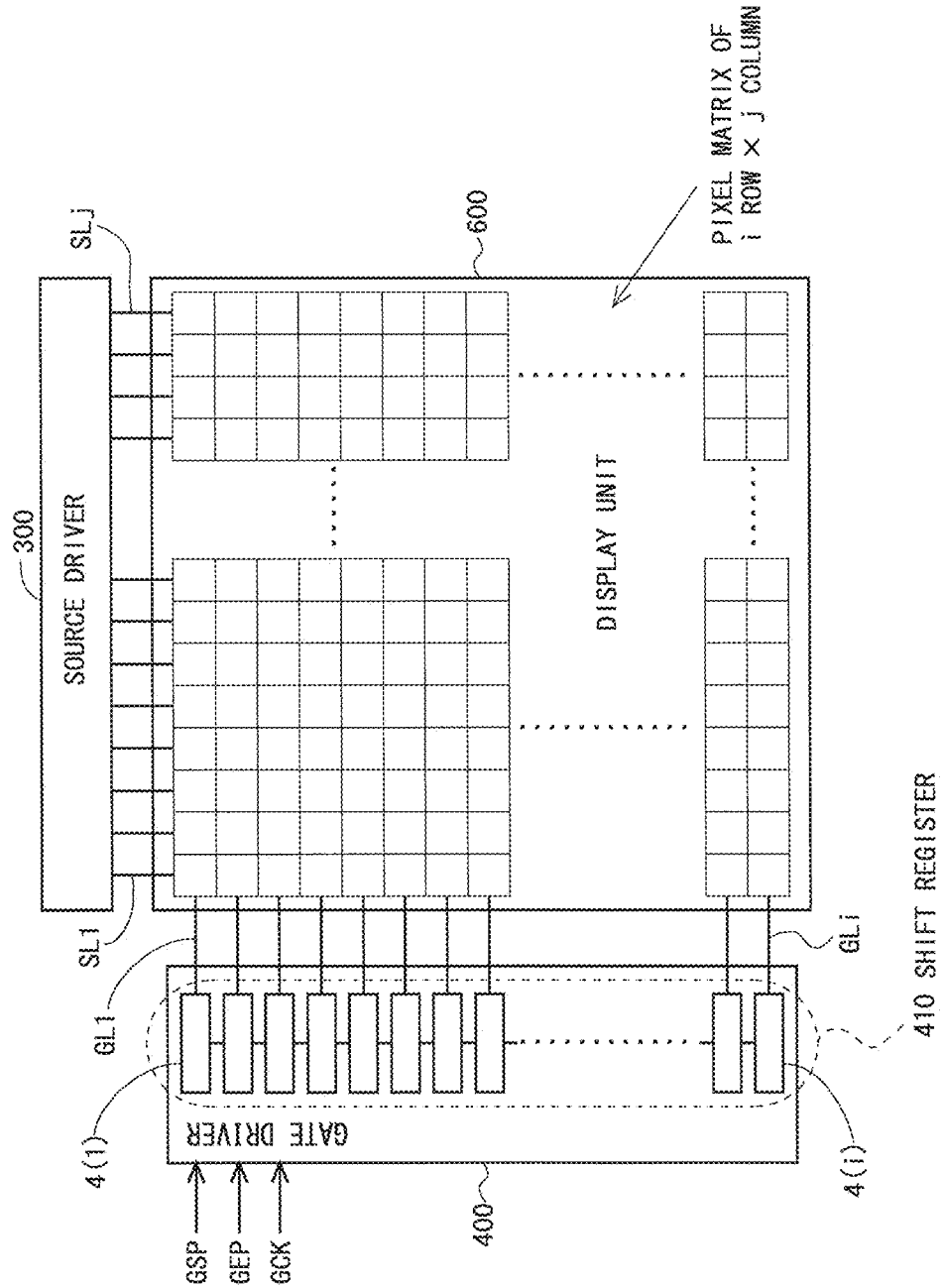
FIG. 3 is a block diagram for describing a configuration of a gate driver in the first embodiment.

Next, with reference to FIGS. 3 to 6, the configuration and overview of operation of the gate driver 400 of the present embodiment will be described. FIG. 3 is a block diagram for describing a configuration of the gate driver 400 of the present embodiment. As shown in FIG. 3, the gate driver 400 is composed of a shift register 410 including a plurality of stages. In the display unit 600 there are formed the pixel matrix of i rows×j columns, and the stages of the shift register 410 are provided in one-to-one correspondence with the rows of the pixel matrix. That is, the shift register 410 includes i unit circuits 4(1) to 4(i). Note that more specifically, for example, four unit circuits serving as dummy stages are provided before the first stage and after the i-th stage (not shown in FIG. 3).

Figure 4:
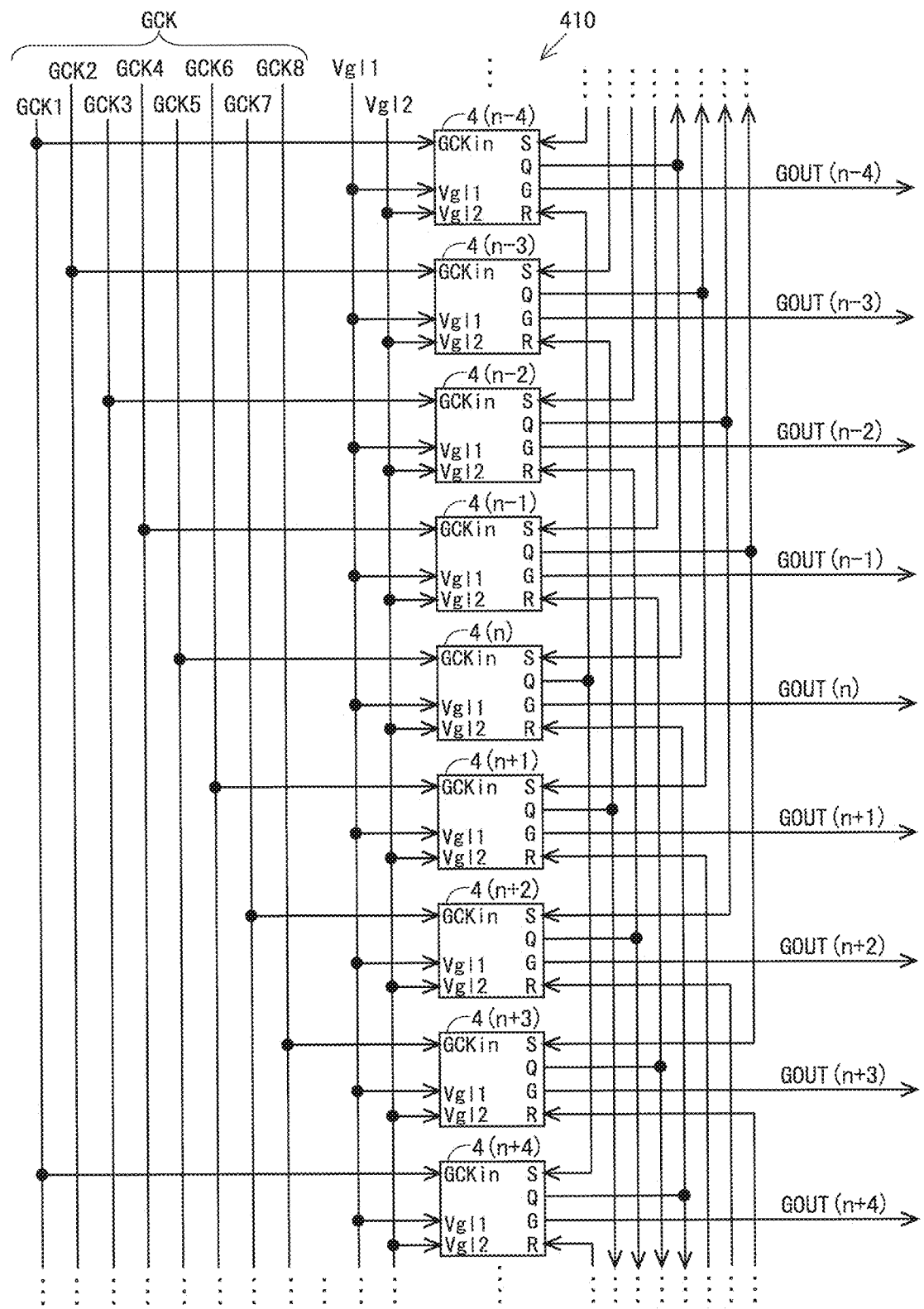
FIG. 4 is a block diagram showing a configuration of a shift register in the gate driver in the first embodiment.

FIG. 4 is a block diagram showing a configuration of the shift register 410 in the gate driver 400. Note that FIG. 4 shows unit circuits 4(n−4) to 4(n+4) of an (n−4)-th stage to an (n+4)-th stage among the i unit circuits 4(1) to 4(i). In the following, when the i unit circuits 4(1) to 4(i) do not need to be distinguished from each other, the unit circuits are simply represented by reference character 4. Gate clock signals GCK include eight-phase clock signals (gate clock signals GCK1 to GCK8). Note that, of the eight-phase clock signals, a clock signal inputted to each unit circuit 4 is given reference character GCKin.

Figure 5:
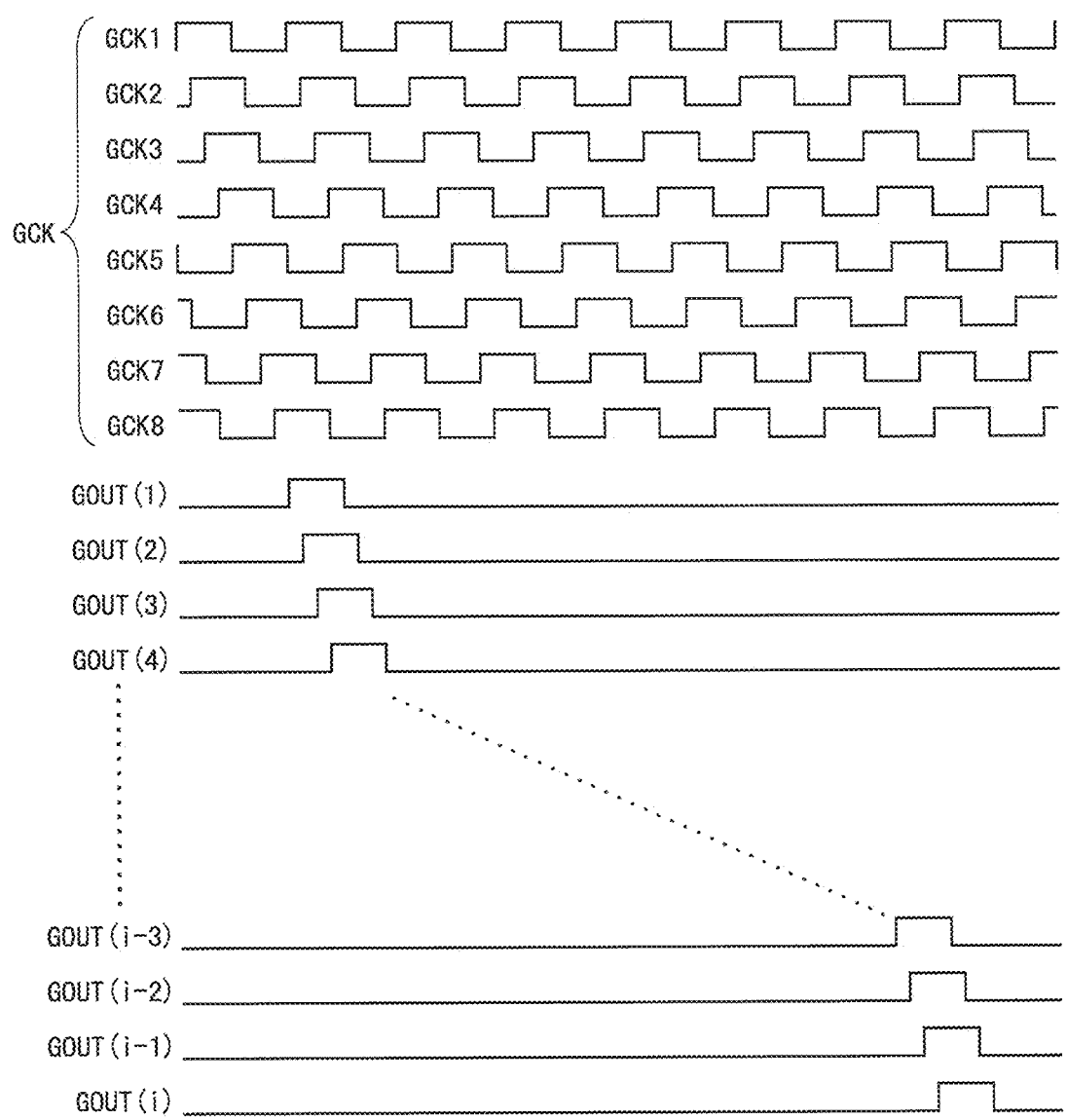
FIG. 5 is a timing chart for describing the operation of the gate driver in the first embodiment.

Signals provided to input terminals of each stage (each unit circuit 4) of the shift register 410 are as follows (see FIG. 4). For the gate clock signals GCK, a gate clock signal GCK1 is provided to the unit circuit 4(n−4) of the (n−4)-th stage, a gate clock signal GCK2 is provided to the unit circuit 4(n−3) of the (n−3)-th stage, a gate clock signal GCK3 is provided to the unit circuit 4(n−2) of the (n−2)-th stage, a gate clock signal GCK4 is provided to the unit circuit 4(n−1) of the (n−1)-th stage, a gate clock signal GCK5 is provided to the unit circuit 4(n) of the n-th stage, a gate clock signal GCK6 is provided to the unit circuit 4(n+1) of the (n+1)-th stage, a gate clock signal GCK7 is provided to the unit circuit 4(n+2) of the (n+2)-th stage, and a gate clock signal GCK8 is provided to the unit circuit 4(n+3) of the (n+3)-th stage. Such a configuration is repeated every eight stages for all stages of the shift register 410. Note that when the gate clock signal GCK1 is defined as a reference, the phase of a gate clock signal GCKz (z is 2 to 8) is delayed by (45×(z−1)) degrees with respect to the phase of the gate clock signal GCK1, as shown in FIG. 5. In addition, regarding a unit circuit 4(k) of any stage (here, a k-th stage), an output signal Q(k−4) outputted from a unit circuit 4(k−4) which is four stages before the k-th stage is provided as a set signal S, and an output signal Q(k+4) outputted from a unit circuit 4(k+4) which is four stages after the k-th stage is provided as a reset signal R (see FIG. 6). The first gate low voltage Vgl1 and the second gate low voltage Vgl2 are provided to all unit circuits 4(1) to 4(i) in a shared manner.

Figure 6:
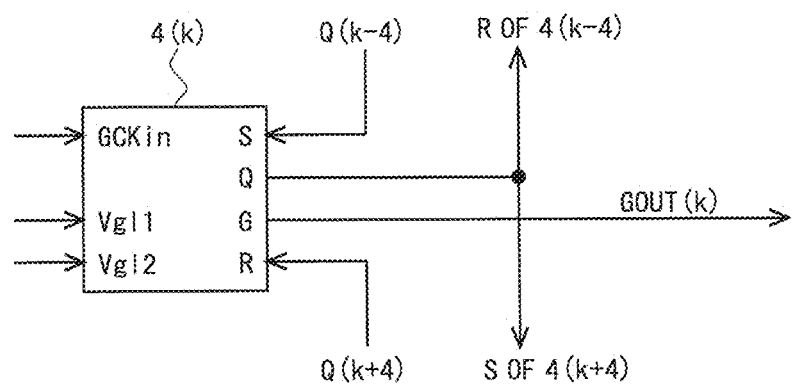
FIG. 6 is a diagram for describing input and output signals to/from each unit circuit of the shift register in the first embodiment.

Two signals (an output signal G and an output signal Q) are outputted from output terminals of each stage (each unit circuit 4) of the shift register 410 (see FIGS. 4 and 6). An output signal G outputted from any stage is provided as a scanning signal GOUT to a gate bus line GL. In addition, an output signal Q outputted from any stage (here, the k-th stage) is provided as a reset signal R to a unit circuit 4(k−4) which is four stages before the k-th stage, and provided as a set signal S to a unit circuit 4(k+4) which is four stages after the k-th stage.

In a configuration such as that described above, when a pulse of a gate start pulse signal GSP serving as a set signal S is provided to a unit circuit 4 serving as a dummy stage which is provided before the first stage of the shift register 410, a shift pulse included in the output signals Q outputted from each unit circuit 4 is sequentially transferred from the unit circuit 4(1) of the first stage to the unit circuit 4(i) of the i-th stage, based on the clock operation of the gate clock signals GCK. Then, in response to the transfer of the shift pulse, the output signals Q and output signals G (scanning signals GOUT) outputted from the respective unit circuits 4 sequentially go to a high level. By this, as shown in FIG. 5, scanning signals GOUT(1) to GOUT(i) which sequentially go to a high level (active) for a predetermined period are provided to the gate bus lines GL1 to GLi in the display unit 600. That is, the i gate bus lines GL1 to GLi sequentially go into a selected state.

Note that although in the present embodiment eight-phase clock signals with a duty ratio of ½ (that is, 50%) are used as the gate clock signals GCK, the duty ratio and number of phases of the gate clock signals GCK are not particularly limited.

<1.2.2 Configuration of the Unit Circuit>

Figure 7:
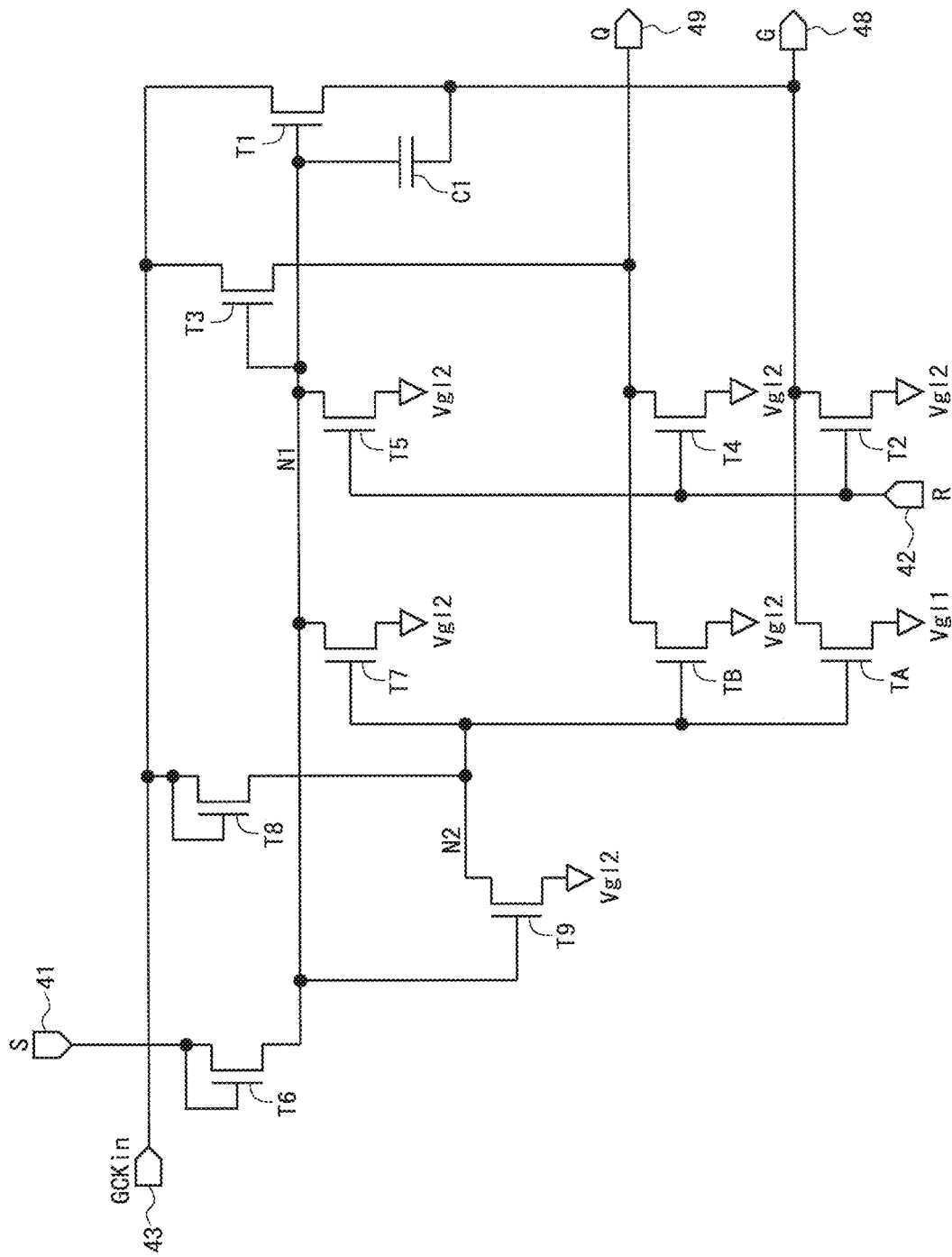
FIG. 7 is a circuit diagram showing a configuration of a unit circuit (a configuration of a portion of the shift register for one stage) in the first embodiment.

FIG. 7 is a circuit diagram showing a configuration of a unit circuit 4 (a configuration of a portion of the shift register 410 for one stage) of the present embodiment. As shown in FIG. 7, the unit circuit 4 includes 11 thin-film transistors T1 to T9, TA, and TB and one capacitor (capacitive element) C1. Moreover, the unit circuit 4 has three input terminals 41 to 43 and two output terminals 48 and 49, in addition to an input terminal for the first gate low voltage Vgl1 and an input terminal for the second gate low voltage Vgl2. Here, an input terminal that receives a set signal S is given reference character 41, an input terminal that receives a reset signal R is given reference character 42, and an input terminal that receives a gate clock signal GCKin is given reference character 43. In addition, an output terminal for outputting an output signal G is given reference character 48, and an output terminal for outputting an output signal Q is given reference character 49. Note that the thin-film transistors T1 to T9, TA, and TB in the unit circuit 4 are implemented by thin-film transistors of the same type as the thin-film transistors 60 in the above-described pixel formation portions (see FIG. 2).

Next, a connection relationship between components in the unit circuit 4 will be described. The gate terminal of the thin-film transistor T1, the gate terminal of the thin-film transistor T3, the drain terminal of the thin-film transistor T5, the source terminal of the thin-film transistor T6, the drain terminal of the thin-film transistor T7, the gate terminal of the thin-film transistor T9, and one end of the capacitor C1 are connected to each other. Note that a region (wiring line) where they are connected to each other is referred to as "first node" for convenience sake. The first node is given reference character N1. The gate terminal of the thin-film transistor T7, the source terminal of the thin-film transistor T8, the drain terminal of the thin-film transistor T9, the gate terminal of the thin-film transistor TA, and the gate terminal of the thin-film transistor TB are connected to each other. Note that a region (wiring line) where they are connected to each other is referred to as "second node" for convenience sake. The second node is given reference character N2.

The thin-film transistor T1 is connected at its gate terminal to the first node N1, connected at its drain terminal to the input terminal 43, and connected at its source terminal to the output terminal 48. The thin-film transistor T2 is connected at its gate terminal to the input terminal 42, connected at its drain terminal to the output terminal 48, and connected at its source terminal to the input terminal for the second gate low voltage Vgl2. The thin-film transistor T3 is connected at its gate terminal to the first node N1, connected at its drain terminal to the input terminal 43, and connected at its source terminal to the output terminal 49. The thin-film transistor T4 is connected at its gate terminal to the input terminal 42, connected at its drain terminal to the output terminal 49, and connected at its source terminal to the input terminal for the second gate low voltage Vgl2. The thin-film transistor T5 is connected at its gate terminal to the input terminal 42, connected at its drain terminal to the first node N1, and connected at its source terminal to the input terminal for the second gate low voltage Vgl2. The thin-film transistor T6 is connected at its gate and drain terminals to the input terminal 41 (i.e., diode-connected) and connected at its source terminal to the first node N1.

The thin-film transistor T7 is connected at its gate terminal to the second node N2, connected at its drain terminal to the first node N1, and connected at its source terminal to the input terminal for the second gate low voltage Vgl2. The thin-film transistor T8 is connected at its gate and drain terminals to the input terminal 43 (i.e., diode-connected) and connected at its source terminal to the second node N2. The thin-film transistor T9 is connected at its gate terminal to the first node N1, connected at its drain terminal to the second node N2, and connected at its source terminal to the input terminal for the second gate low voltage Vgl2. The thin-film transistor TA is connected at its gate terminal to the second node N2, connected at its drain terminal to the output terminal 48, and connected at its source terminal to the input terminal for the first gate low voltage Vgl1. The thin-film transistor TB is connected at its gate terminal to the second node N2, connected at its drain terminal to the output terminal 49, and connected at its source terminal to the input terminal for the second gate low voltage Vgl2. The capacitor C1 is connected at its one end to the first node N1 and connected at its other end to the output terminal 48.

Note that the thin-film transistor T2 corresponds to the gate-output fall transistor T01 in FIG. 1, and the thin-film transistor TA corresponds to the gate-output stabilization transistor T02 in FIG. 1.

Next, the functions of the respective components in the unit circuit 4 will be described. The thin-film transistor T1 provides the voltage of the gate clock signal GCKin to the output terminal 48 when the potential at the first node N1 is at a high level. The thin-film transistor T2 changes the output signal G toward the second low level when the reset signal R is at a high level. The thin-film transistor T3 provides the voltage of the gate clock signal GCKin to the output terminal 49 when the potential at the first node N1 is at a high level. The thin-film transistor T4 changes the output signal Q toward the second low level when the reset signal R is at a high level. The thin-film transistor T5 changes the potential at the first node N1 toward the second low level when the reset signal R is at a high level.

The thin-film transistor T6 changes the potential at the first node N1 toward a high level when the set signal S is at a high level. The thin-film transistor T7 changes the potential at the first node N1 toward the second low level when the potential at the second node N2 is at a high level. The thin-film transistor T8 changes the potential at the second node N2 toward a high level when the gate clock signal GCKin is at a high level. The thin-film transistor T9 changes the potential at the second node N2 toward the second low level when the potential at the first node N1 is at a high level. The thin-film transistor TA changes the output signal G toward the first low level when the potential at the second node N2 is at a high level. The thin-film transistor TB changes the output signal Q toward the second low level when the potential at the second node N2 is at a high level. The capacitor C1 functions as a bootstrap capacitor for increasing the potential at the first node N1.

Although, in the present embodiment, the potential at the second node N2 is controlled by the thin-film transistors T8 and T9 having a configuration shown in FIG. 7, the configuration is not limited thereto. The potential at the second node N2 may be controlled by other configurations than the configuration shown in FIG. 7 as long as the potential at the second node N2 is at a low level during a period during which the potential at the first node N1 is to be maintained at a high level, and the potential at the second node N2 is at a high level during a period during which the gate clock signal GCKin is at a high level out of a period during which the potential at the first node N1 is to be maintained at a low level.

Note that, in the present embodiment, a selection control transistor is implemented by the thin-film transistor T1, a non-selection control transistor is implemented by the thin-film transistor T2, an output control transistor is implemented by the thin-film transistor T3, a non-output control transistor is implemented by the thin-film transistor T4, a first-node turn-off transistor is implemented by the thin-film transistor T5, a first-node turn-on transistor is implemented by the thin-film transistor T6, a first first-node stabilization transistor is implemented by the thin-film transistor T7, a second-node turn-on transistor is implemented by the thin-film transistor T8, a second-node turn-off transistor is implemented by the thin-film transistor T9, a first-output-node stabilization transistor is implemented by the thin-film transistor TA, and a second-output-node stabilization transistor is implemented by the thin-film transistor TB. In addition, a first output node is implemented by the output terminal 48, and a second output node is implemented by the output terminal 49.

<1.2.3 Operation of the Unit Circuit>

Figure 8:
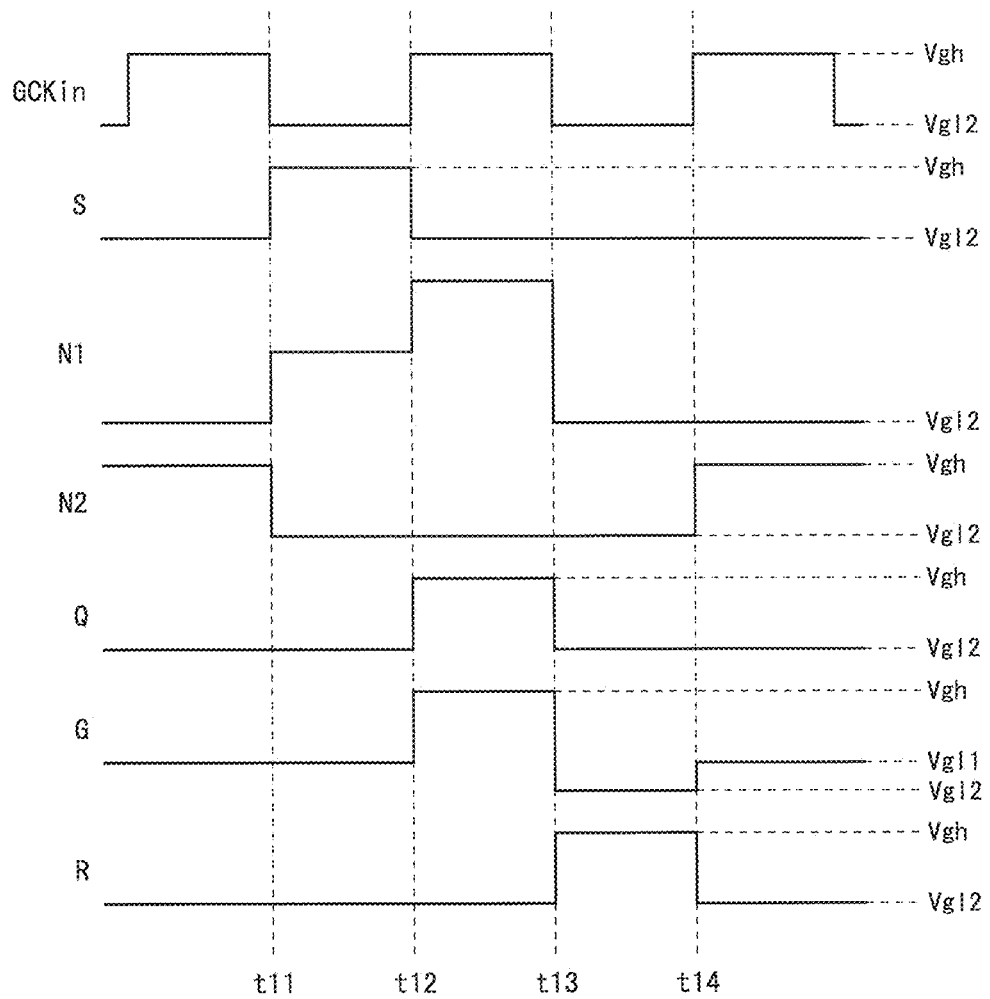
FIG. 8 is a timing chart for describing the operation of the unit circuit in the first embodiment.

Next, with reference to FIG. 8, the operation of a unit circuit 4 of the present embodiment will be described. Note that here a delay in waveform is ignored.

The gate clock signal GCKin alternately repeats a high level and a low level throughout an operating period of the liquid crystal display device. The high-level voltage of the gate clock signal GCKin is a voltage (hereinafter, referred to as "gate high voltage") Vgh having a voltage level that brings the gate bus line GL into a selected state. The low-level voltage of the gate clock signal GCKin is, in the present embodiment, the second gate low voltage Vgl2.

Note, however, that the low-level voltage of the gate clock signal GCKin is not limited to the second gate low voltage Vgl2 as long as the voltage has a voltage level that brings the gate bus line GL into a non-selected state.

During a period before time point t11, the set signal S is at the second low level, the potential at the first node N1 is at the second low level, the potential at the second node N2 is at the high level, the output signal Q is at the second low level, the output signal G is at the first low level, and the reset signal R is at the second low level. Meanwhile, parasitic capacitances are present in the thin-film transistors in the unit circuit 4. Hence, during the period before time point t11, fluctuations can occur in the potential at the first node N1 due to the clock operation of the gate clock signal GCKin and the presence of parasitic capacitances in the thin-film transistors T1 and T3 (see FIG. 7). By this, the voltage of the output signal G, i.e., the voltage of the scanning signal GOUT provided to the gate bus line GL, can increase. However, the thin-film transistor T7 is maintained in an on state during a period during which the potential at the second node N2 is maintained at the high level. Therefore, during the period before time point t11, the thin-film transistor T7 is maintained in an on state, and the potential at the first node N1 is securely maintained at the second low level. By the above, even when noise caused by the clock operation of the gate clock signal GCKin mixes in the first node N1, an increase in the voltage of the corresponding scanning signal GOUT does not occur. By this, the occurrence of a malfunction, such as display failure, caused by the clock operation of the gate clock signal GCKin is prevented.

At time point t11, the set signal S changes from the second low level to the high level. Since the thin-film transistor T6 is diode-connected as shown in FIG. 7, the thin-film transistor T6 goes into an on state by a pulse of the set signal S and the potential at the first node N1 increases. By this, the thin-film transistors T1, T3, and T9 go into an on state. By the thin-film transistor T9 going into an on state, the potential at the second node N2 goes to the second low level. Note that during a period from time point t11 to time point t12, since the gate clock signal GCKin is at the low level, even when the thin-film transistor T1 is in an on state, the output signal G is maintained at the second low level, and even when the thin-film transistor T3 is in an on state, the output signal Q is maintained at the second low level. In addition, during the period from time point t11 to time point t12, the reset signal R is maintained at the second low level, and the potential at the second node N2 is also maintained at the second low level. Therefore, during this period, a decrease in the potential at the first node N1 caused by the provision of the thin-film transistors T5 and T7 does not occur.

At time point t12, the gate clock signal GCKin changes from the low level to the high level. At this time, since the thin-film transistor T1 is in an on state, the potential at the output terminal 48 increases with an increase in the potential at the input terminal 43. Here, since the capacitor C1 is provided between the first node N1 and the output terminal 48 as shown in FIG. 7, the potential at the first node N1 also increases with the increase in the potential at the output terminal 48 (the first node N1 is bootstrapped). As a result, a large voltage is applied to the gate terminals of the thin-film transistors T1 and T3, and the voltage of the output signal G and the voltage of the output signal Q increase to the voltage level of the high-level voltage of the gate clock signal GCKin (i.e., the voltage level of the gate high voltage Vgh). Note that during a period from time point t12 to time point t13, the reset signal R is maintained at the second low level, and the potential at the second node N2 is also maintained at the second low level. Therefore, during this period, a decrease in the potential at the first node N1 caused by the provision of the thin-film transistors T5 and T7 does not occur, a decrease in the voltage of the output signal G caused by the provision of the thin-film transistors T2 and TA does not occur, and a decrease in the voltage of the output signal Q caused by the provision of the thin-film transistors 14 and TB does not occur.

At time point t13, the reset signal R changes from the second low level to the high level. By this, the thin-film transistors T2, T4, and T5 go into an on state. The output signal G (i.e., the scanning signal GOUT) goes to the second low level by the thin-film transistor T2 going into an on state, the output signal Q goes to the second low level by the thin-film transistor 14 going into an on state, and the potential at the first node N1 goes to the second low level by the thin-film transistor T5 going into an on state.

At time point t14, the gate clock signal GCKin changes from the low level to the high level. Since the thin-film transistor T8 is diode-connected as shown in FIG. 7, by the gate clock signal GCKin changing from the low level to the high level, the potential at the second node N2 goes to the high level. By this, the thin-film transistors T7, TA, and TB go into an on state. By the thin-film transistor T7 going into an on state, even when noise caused by the clock operation of the gate clock signal GCKin mixes in the first node N1 during a period after time point t14, the potential at the first node N1 is drawn to the second low level. In addition, by the thin-film transistor TB going into an on state, even when noise caused by the clock operation of the gate clock signal GCKin mixes in the output terminal 49 during the period after time point t14, the output signal Q is drawn to the second low level. In addition, by the thin-film transistor TA going into an on state, the output signal G changes from the second low level to the first low level. Then, during the period after time point t14, the same operation as that for the period before time point t11 is performed.

By performing operation such as that described above in the respective unit circuits 4, the plurality of gate bus lines GL(1) to GL(i) provided in the liquid crystal display device sequentially go into a selected state, and writing to the pixel capacitances is sequentially performed. By this, an image based on the image signal DAT transmitted from the external source is displayed on the display unit 600 (see FIG. 2).

<1.3 Effects>

Figure 9:
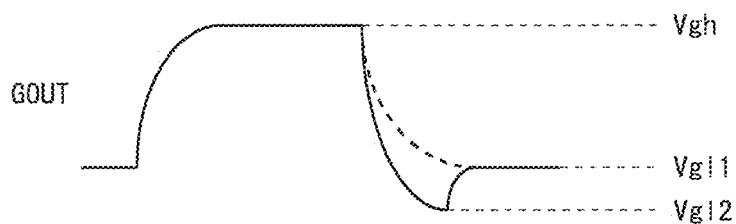
FIG. 9 is a diagram for describing an effect of the first embodiment.
Figure 10:
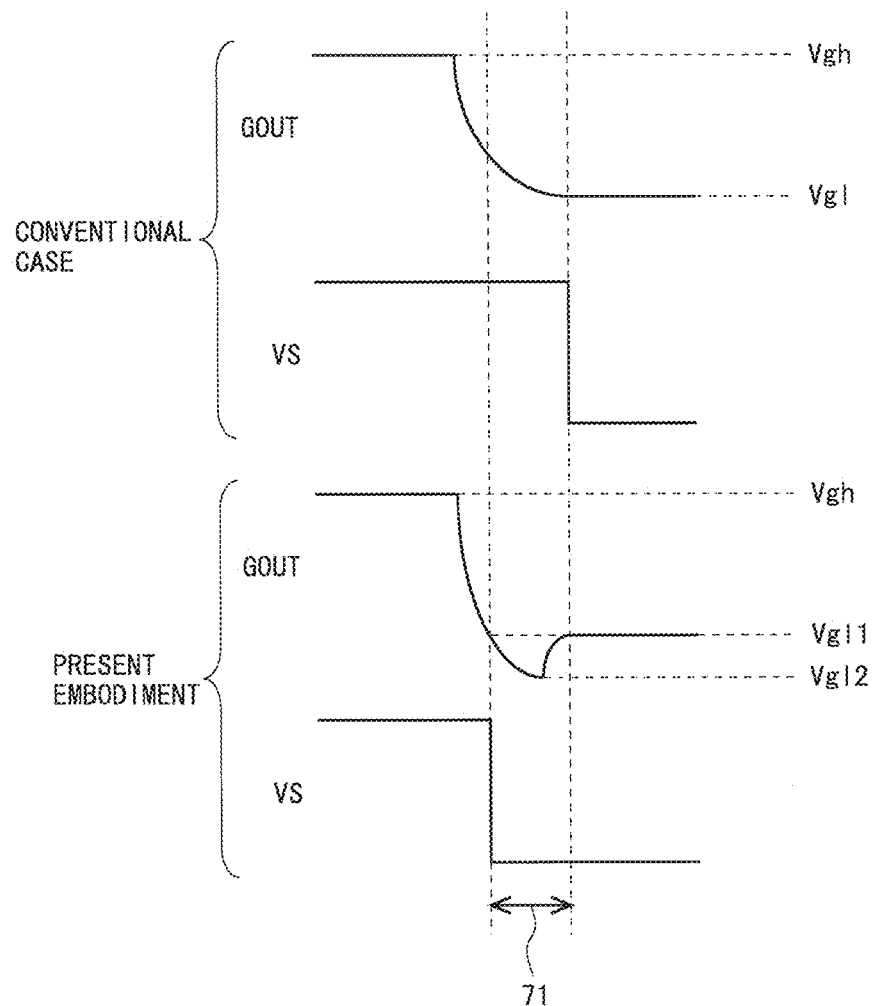
FIG. 10 is a diagram for describing an effect of the first embodiment.

According to the present embodiment, as a low-level direct-current power supply voltage for controlling the operation of the gate driver 400, there are prepared the first gate low voltage Vgl1 having a voltage level that is conventionally used to bring the pixel TFTs (the thin-film transistors 60 in FIG. 2) into an off state (bring the gate bus lines GL into a non-selected state), and the second gate low voltage Vgl2 having a lower voltage level than the voltage level of the first gate low voltage Vgl1. The second gate low voltage Vgl2 is provided to the source terminal of the thin-film transistor T2 which is a transistor for allowing a gate output to fall, and the first gate low voltage Vgl1 is provided to the source terminal of the thin-film transistor TA which is a transistor for maintaining the gate output at a non-selected level (a voltage level that brings the pixel TFTs into an off state) during a normal operating period. Hence, upon allowing the gate output to fall, the voltage of the scanning signal GOUT temporarily decreases to the voltage level of the second gate low voltage Vgl2 from the voltage level of the gate high voltage Vgh, and then changes to the voltage level of the first gate low voltage Vgl, as shown in FIG. 9. That is, the voltage of the scanning signal GOUT is temporarily drawn to a lower level than the conventional non-selection level. Therefore, the change rate of the voltage of the scanning signal GOUT becomes higher than a conventional one, and the gate-output fall time becomes shorter than a conventional one. By this, the length from a point in time of start of a gate-output fall to a point in time of switching a source voltage VS can be made shorter than a conventional one. In an example shown in FIG. 10, the length from a point in time of start of a gate-output fall to a point in time of switching a source voltage VS is shorter in the present embodiment than a conventional case by a period indicated by an arrow given reference character 71. Since the gate-output fall time is reduced as described above, it becomes possible to make the length of one horizontal scanning period shorter than a conventional one. That is, it becomes possible to achieve the improvement in definition and increase in size regarding a liquid crystal panel. In addition, unlike a liquid crystal display device disclosed in International Publication No. 2011/080936 pamphlet, a significant deterioration in a transistor for allowing a gate output to fall (thin-film transistor T2) does not occur. Hence, an effect of the reduction in gate-output fall time lasts. As described above, according to the present embodiment, the gate driver 400 capable of allowing a gate output to promptly fall without causing a deterioration in a transistor is implemented.

2. Second Embodiment

<2.1 Overview>

In the above-described first embodiment, the gate clock signal GCKin is provided to the drain terminal of the thin-film transistor T1 in the unit circuit 4 (see FIG. 7). Since such a configuration is adopted, a relatively large capacitance needs to be driven by the gate clock signal GCKin which is an alternating-current signal. Due to this, power consumption is relatively large. Hence, a liquid crystal display device according to the present embodiment adopts a configuration in which a high-level direct-current power supply voltage VDD is provided to the drain terminal of the thin-film transistor T1.

An overall configuration and a schematic configuration of the gate driver 400 are the same as those of the above-described first embodiment and thus description thereof is omitted (see FIGS. 2 and 3). Differences from the first embodiment will be mainly described below.

<2.2 Gate Driver>

<2.2.1 Configuration of a Shift Register>

Figure 11:
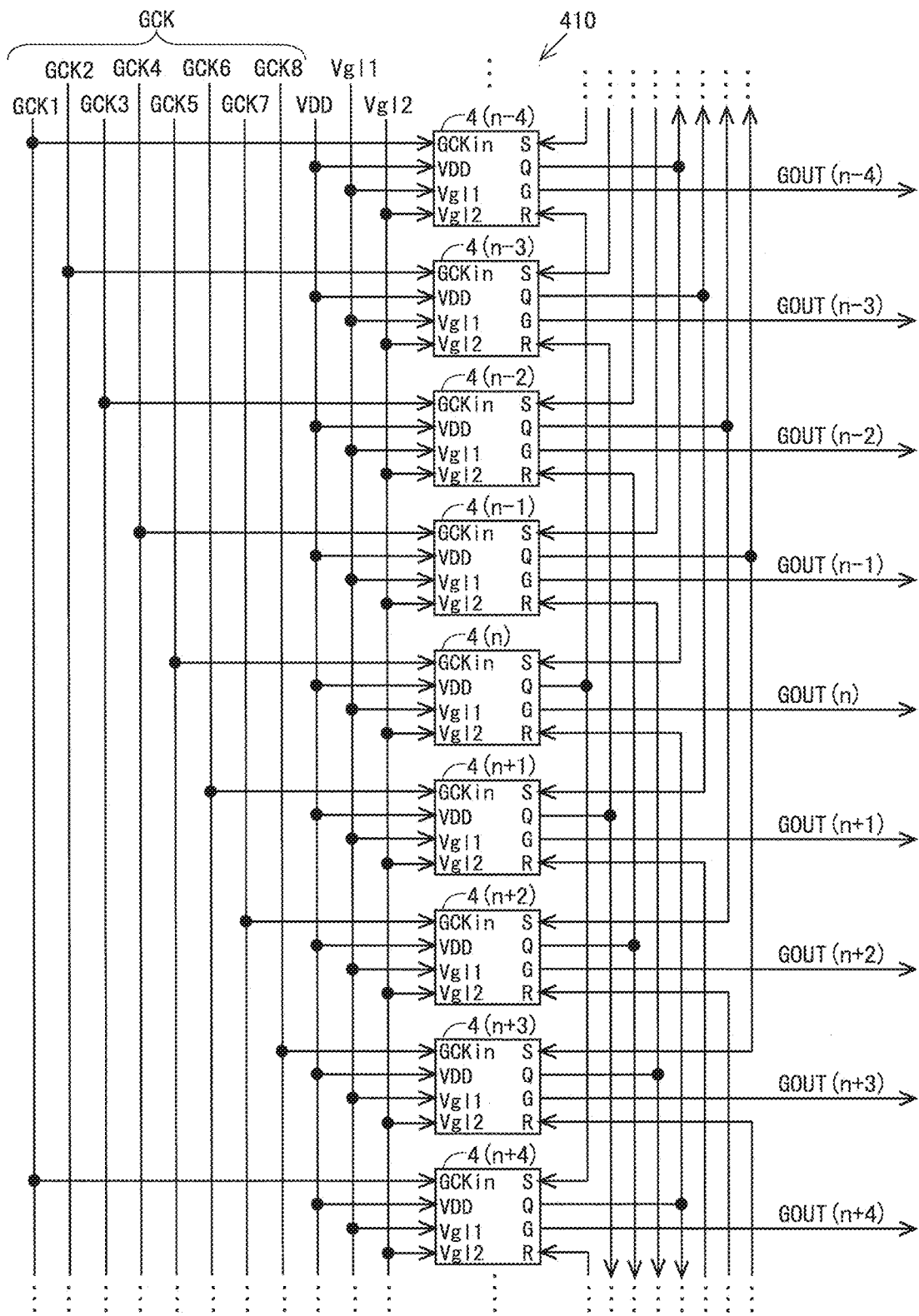
FIG. 11 is a block diagram showing a configuration of a shift register in a gate driver in a second embodiment.

FIG. 11 is a block diagram showing a configuration of a shift register 410 of the present embodiment. In the present embodiment, a high-level direct-current power supply voltage VDD is provided to each unit circuit 4 that constitutes the shift register 410, in addition to the same signals and voltages as those of the above-described first embodiment. Note that the voltage level of the direct-current power supply voltage VDD is the voltage level of the above-described gate high voltage Vgh.

<2.2.2 Configuration of the Unit Circuit>

Figure 12:
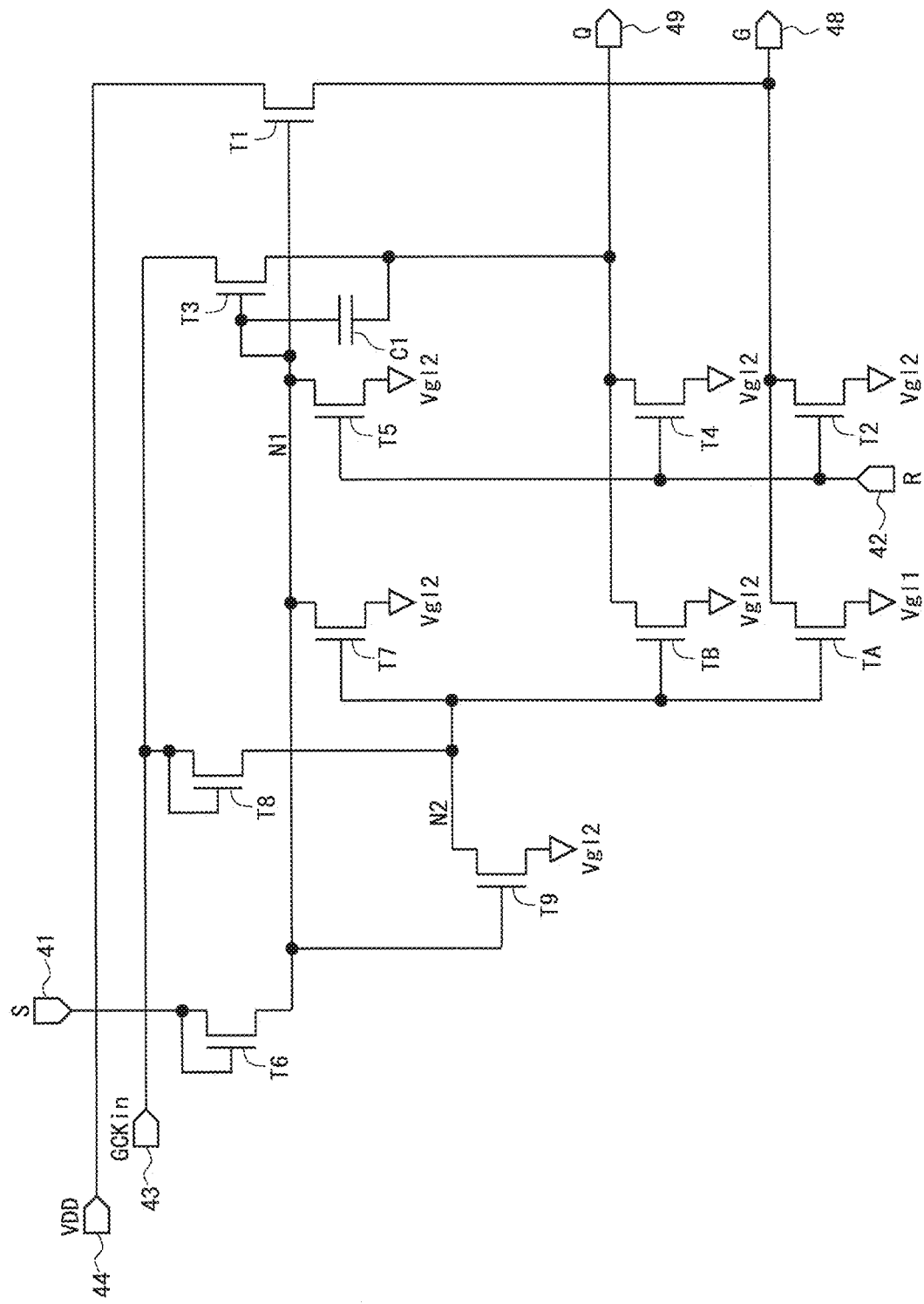
FIG. 12 is a circuit diagram showing a configuration of a unit circuit (a configuration of a portion of the shift register for one stage) in the second embodiment.

FIG. 12 is a circuit diagram showing a configuration of a unit circuit 4 (a configuration of a portion of the shift register 410 for one stage) of the present embodiment. In addition to the components of the above-described first embodiment (see FIG. 7), an input terminal 44 that receives the high-level direct-current power supply voltage VDD is provided. In the present embodiment, the drain terminal of the thin-film transistor T1 is connected to the input terminal 44. That is, the high-level direct-current power supply voltage VDD is provided to the drain terminal of the thin-film transistor T1. In addition, although the other end of the capacitor C1 is connected to the output terminal 48 in the first embodiment, the other end of the capacitor C1 is connected to the output terminal 49 in the present embodiment. In other words, the capacitor C1 is provided between the gate and source of the thin-film transistor T3.

<2.2.3 Operation of the Unit Circuit>

Figure 13:
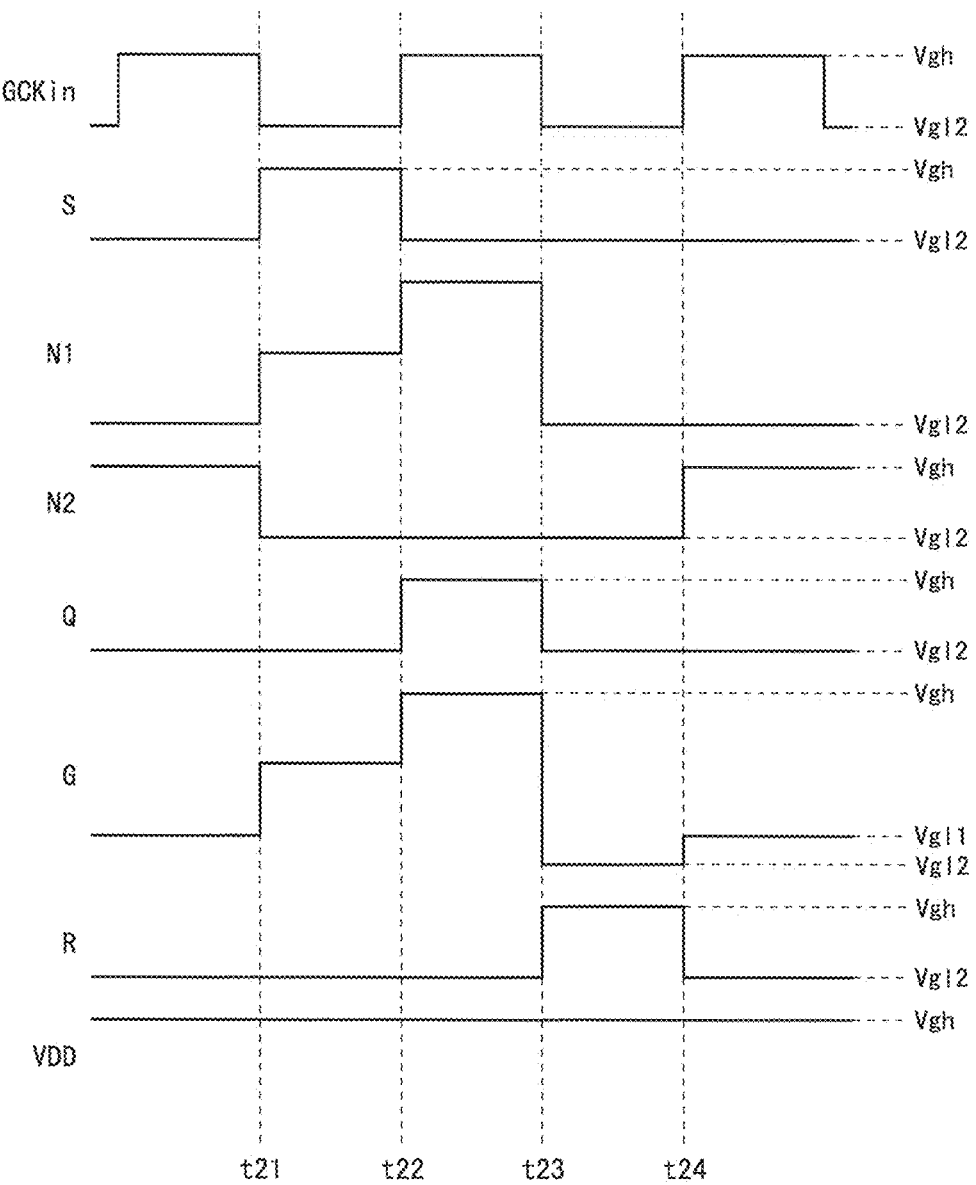
FIG. 13 is a timing chart for describing the operation of the unit circuit in the second embodiment.

Next, with reference to FIG. 13, the operation of a unit circuit 4 of the present embodiment will be described. Note that here a delay in waveform is ignored.

During a period before time point t21, the same operation as that for the period before time point t11 in the above-described first embodiment (see FIG. 8) is performed. At time point t21, the set signal S changes from the second low level to the high level. Since the thin-film transistor T6 is diode-connected as shown in FIG. 12, the thin-film transistor T6 goes into an on state by a pulse of the set signal S and the potential at the first node N1 increases. By this, the thin-film transistors T1, T3, and T9 go into an on state. By the thin-film transistor T1 going into an on state, the voltage of the output signal G increases. Note, however, that the voltage of the output signal G increases to a voltage level lower by a threshold voltage of the thin-film transistor T1 than the voltage level of the direct-current power supply voltage VDD (i.e., the voltage level of the gate high voltage Vgh). In addition, by the thin-film transistor T9 going into an on state, the potential at the second node N2 goes to the second low level. Note that during a period from time point t21 to time point t22, the gate clock signal GCKin is at the low level, and thus, even when the thin-film transistor T3 is in an on state, the output signal Q is maintained at the second low level. In addition, during the period from time point t21 to time point t22, the reset signal R is maintained at the second low level, and the potential at the second node N2 is also maintained at the second low level. Therefore, during this period, a decrease in the potential at the first node N1 caused by the provision of the thin-film transistors T5 and T7 does not occur.

At time point t22, the gate clock signal GCKin changes from the low level to the high level. At this time, since the thin-film transistor T3 is in an on state, the potential at the output terminal 49 increases with an increase in the potential at the input terminal 43. Here, since the capacitor C1 is provided between the first node N1 and the output terminal 49 as shown in FIG. 12, the potential at the first node N1 also increases with the increase in the potential at the output terminal 49 (the first node N1 is bootstrapped). As a result, a large voltage is applied to the gate terminals of the thin-film transistors T1 and T3, and the voltage of the output signal G increases to the voltage level of the direct-current power supply voltage VDD (i.e., the voltage level of the gate high voltage Vgh) and the voltage of the output signal Q increases to the voltage level of the high-level voltage of the gate clock signal GCKin (i.e., the voltage level of the gate high voltage Vgh). Note that during a period from time point t22 to time point t23, the reset signal R is maintained at the second low level, and the potential at the second node N2 is also maintained at the second low level. Therefore, during this period, a decrease in the potential at the first node N1 caused by the provision of the thin-film transistors T5 and T7 does not occur, a decrease in the voltage of the output signal G caused by the provision of the thin-film transistors T2 and TA does not occur, and a decrease in the voltage of the output signal Q caused by the provision of the thin-film transistors T4 and TB does not occur. During a period after time point t23, the same operation as that for a period after time point t13 in the above-described first embodiment (see FIG. 8) is performed.

By performing operation such as that described above in the respective unit circuits 4, as in the above-described first embodiment, the plurality of gate bus lines GL(1) to GL(i) provided in the liquid crystal display device sequentially go into a selected state, and writing to the pixel capacitances is sequentially performed. By this, an image based on the image signal DAT transmitted from the external source is displayed on the display unit 600 (see FIG. 2).

<2.3 Effects>

As in the above-described first embodiment, also in the present embodiment, upon allowing a gate output to fall, the voltage of the scanning signal GOUT is temporarily drawn to a lower level than the conventional non-selection level. Therefore, the gate-output fall time becomes shorter than a conventional one, and it becomes possible to make the length of one horizontal scanning period shorter than a conventional one. In addition, as in the above-described first embodiment, a significant deterioration in a transistor for allowing a gate output to fall (thin-film transistor T2) does not occur. By the above, the gate driver 400 capable of allowing a gate output to promptly fall without causing a deterioration in a transistor is implemented. In addition, according to the present embodiment, since a gate load is driven by the high-level direct-current power supply voltage VDD, a capacitance that needs to be driven by the gate clock signal GCKin is small. As a result, power consumption is reduced compared to the above-described first embodiment.

<2.4 Variants>

Variants of the above-described second embodiment will be described below.

<2.4.1 First Variant>

Figure 14:
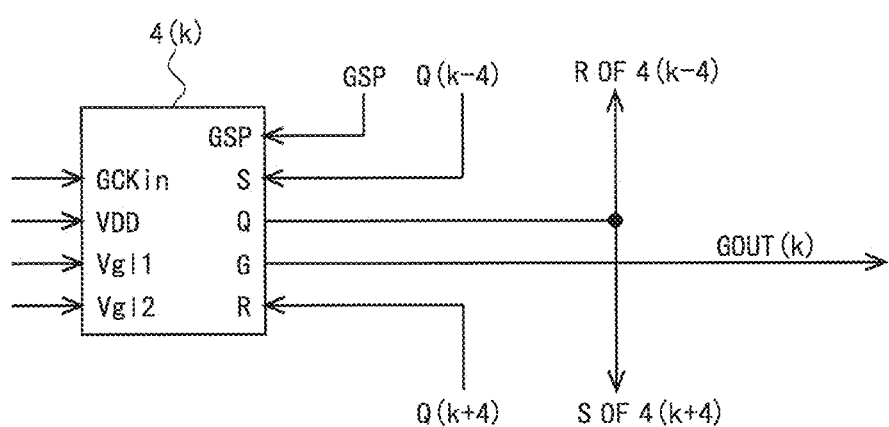
FIG. 14 is a diagram for describing input and output signals to/from each unit circuit of a shift register in a first variant of the second embodiment.

FIG. 14 is a diagram for describing input and output signals to/from a unit circuit 4 of the present variant. As shown in FIG. 14, in the present variant, a gate start pulse signal GSP is provided to each unit circuit 4, in addition to the input signals of the above-described second embodiment.

Figure 15:
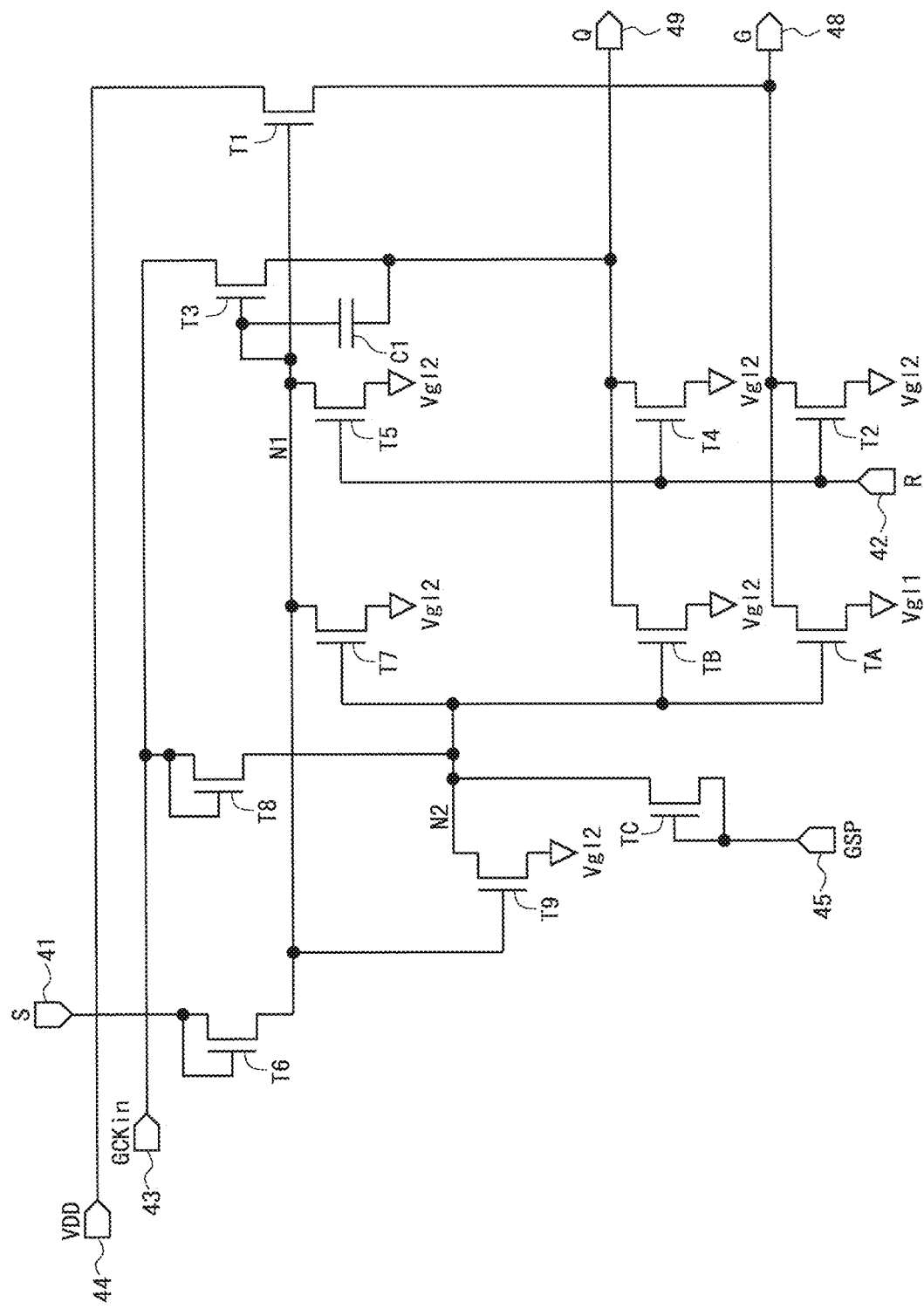
FIG. 15 is a circuit diagram showing a configuration of a unit circuit (a configuration of a portion of the shift register for one stage) in the first variant of the second embodiment.

FIG. 15 is a circuit diagram showing a configuration of a unit circuit 4(a configuration of a portion of the shift register 410 for one stage) of the present variant. In the present variant, in the unit circuit 4, there is provided a thin-film transistor TC in addition to the components of the above-described second embodiment (see FIG. 12). In addition, in the unit circuit 4 there is provided an input terminal 45 that receives a gate start pulse signal GSP. The thin-film transistor TC is connected at its gate and drain terminals to the input terminal 45 (i.e., diode-connected) and connected at its source terminal to the second node N2. The thin-film transistor TC changes the potential at the second node N2 toward the high level when the gate start pulse signal GSP is at the high level. Note that a second-node initial charging transistor is implemented by the thin-film transistor TC.

Figure 16:
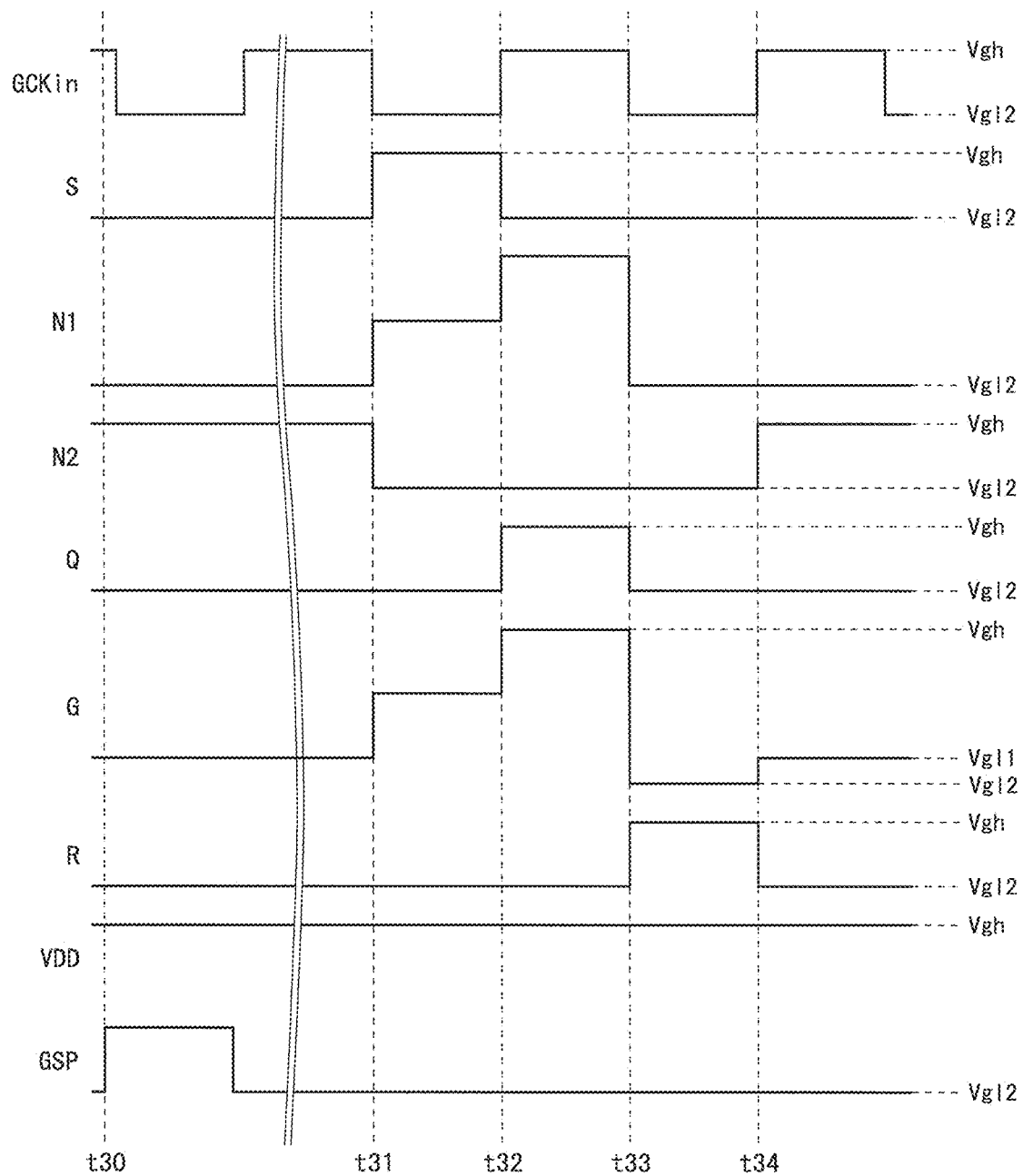
FIG. 16 is a timing chart for describing the operation of the unit circuit in the first variant of the second embodiment.

FIG. 16 is a timing chart for describing the operation of the unit circuit 4 of the present variant. In the present variant, the same operation as that of the above-described second embodiment is performed except for the following points. When the gate start pulse signal GSP goes to the high level at the beginning of each frame period, the second node N2 is charged through the thin-film transistor TC, and the potential at the second node N2 securely goes to the high level.

In the above-described second embodiment, there is a concern that during a period before the second node N2 is charged through the thin-film transistor T8 by the gate clock signal GCKin going to the high level, the state of the thin-film transistor TA is not determined and the voltage level of the output signal G (scanning signal GOUT) becomes unstable. In this regard, according to the present variant, the second node N2 is charged through the thin-film transistor TC immediately after the start of each frame period, based on the gate start pulse signal GSP. Hence, the thin-film transistor TA is maintained in an on state, and the output signal G (scanning signal GOUT) is securely maintained at the first low level. By this, the occurrence of display failure is suppressed.

<2.4.2 Second Variant>

Figure 17:
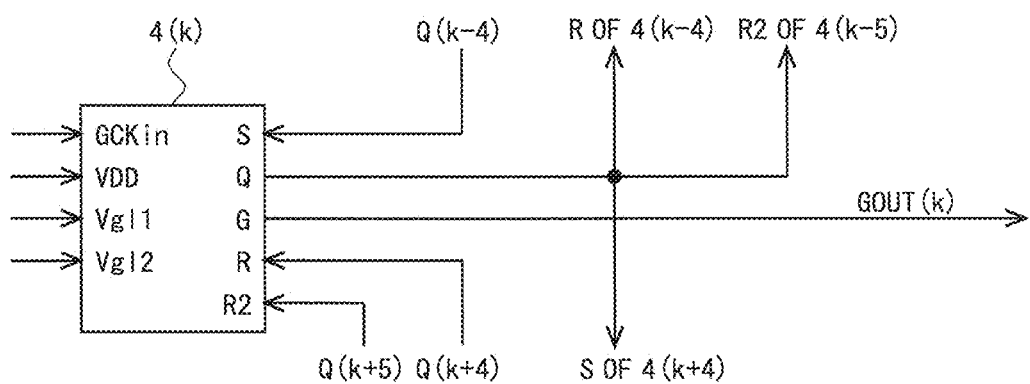
FIG. 17 is a diagram for describing input and output signals to/from each unit circuit of a shift register in a second variant of the second embodiment.

FIG. 17 is a diagram for describing input and output signals to/from a unit circuit 4 of the present variant. As shown in FIG. 17, in the present variant, a second reset signal R2 is provided to each unit circuit 4, in addition to the input signals of the above-described second embodiment. Specifically, regarding a unit circuit 4(k) of any stage (here, a k-th stage), an output signal Q(k+5) outputted from a unit circuit 4(k+5) which is five stages after the k-th stage is provided as a second reset signal R2. With this, an output signal Q outputted from any stage is also provided as a second reset signal R2 to a unit circuit 4(k−5) which is five stages before the k-th stage.

Figure 18:
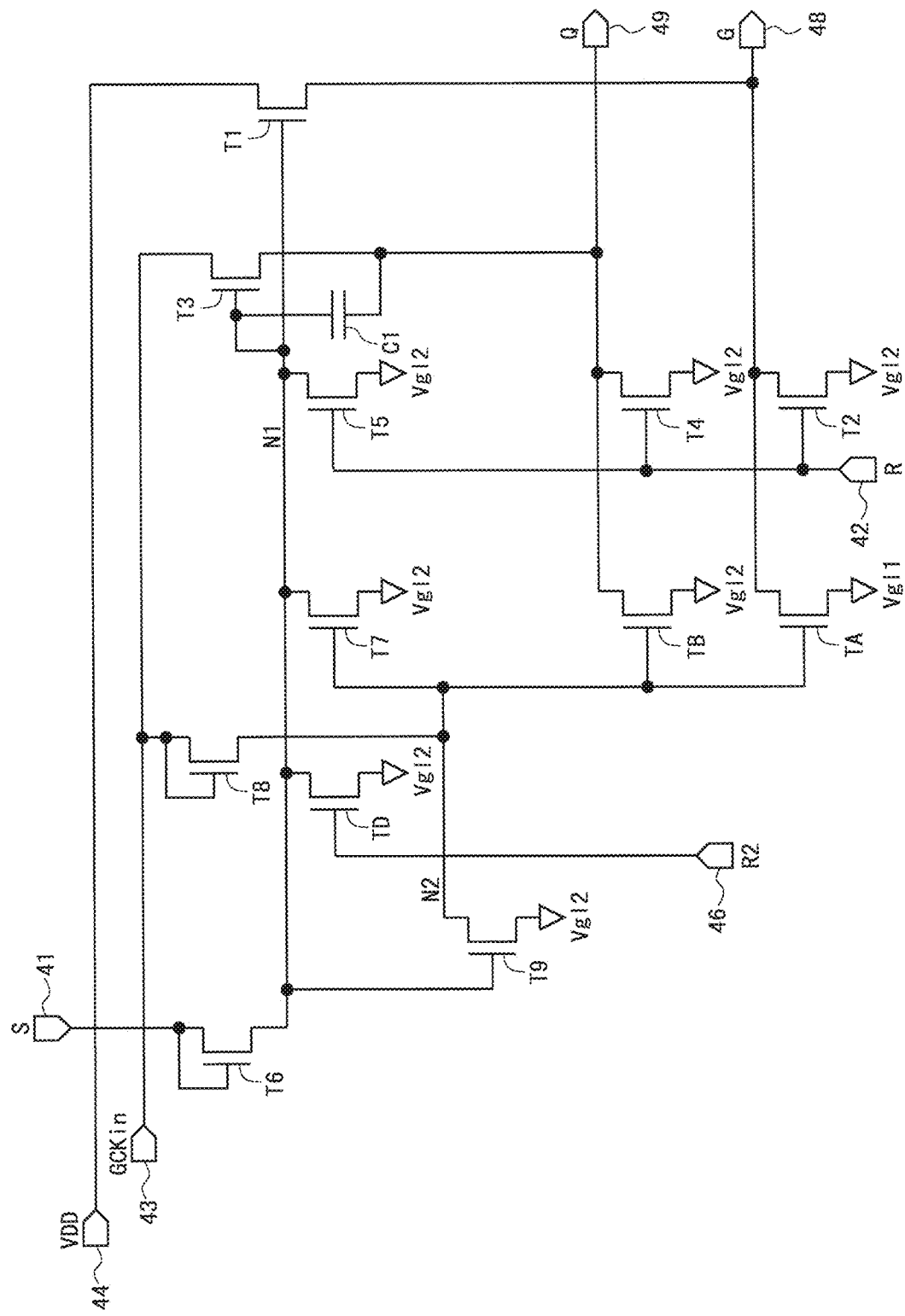
FIG. 18 is a circuit diagram showing a configuration of a unit circuit (a configuration of a portion of the shift register for one stage) in the second variant of the second embodiment.

FIG. 18 is a circuit diagram showing a configuration of a unit circuit 4(a configuration of a portion of the shift register 410 for one stage) of the present variant. In the present variant, in the unit circuit 4, there is provided a thin-film transistor TD in addition to the components of the above-described second embodiment. In addition, in the unit circuit 4, there is provided an input terminal 46 that receives a second reset signal R2. The thin-film transistor TD is connected at its gate terminal to the input terminal 46, connected at its drain terminal to the first node N1, and connected at its source terminal to the input terminal for the second gate low voltage Vgl2. The thin-film transistor TD changes the potential at the first node N1 toward the second low level when the second reset signal R2 is at the high level. Note that a second first-node stabilization transistor is implemented by the thin-film transistor TD.

Figure 19:
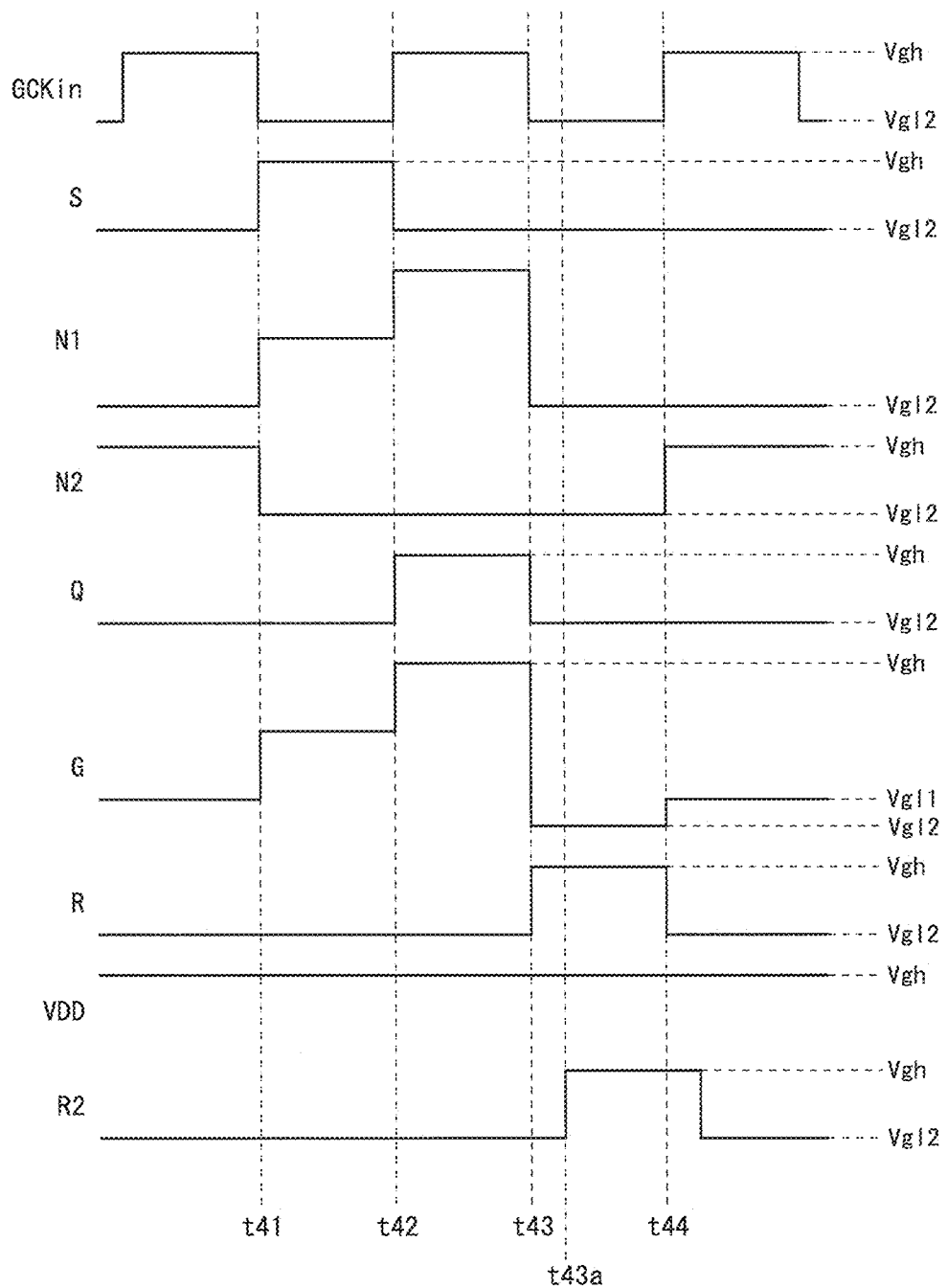
FIG. 19 is a timing chart for describing the operation of the unit circuit in the second variant of the second embodiment.

FIG. 19 is a timing chart for describing the operation of the unit circuit 4 of the present variant. During a period before time point t43, the same operation as that for a period before time point t23 of the above-described second embodiment (see FIG. 13) is performed. After the output signal Q and the output signal G fall at time point t43 based on the reset signal R, at time point t43a the second reset signal R2 changes from the second low level to the high level. By this, the thin-film transistor TD goes into an on state. As a result, the potential at the first node N1 is drawn to the second low level.

At time point t44, the gate clock signal GCKin changes from the low level to the high level. Since the thin-film transistor T8 is diode-connected as shown in FIG. 18, by the gate clock signal GCKin changing from the low level to the high level, the potential at the second node N2 goes to the high level. By this, the thin-film transistors T7, TA, and TB go into an on state. By the thin-film transistor T7 going into an on state, even when noise caused by the clock operation of the gate clock signal GCKin mixes in the first node N1 during a period after time point t44, the potential at the first node N1 is drawn to the second low level. In addition, by the thin-film transistor TB going into an on state, even when noise caused by the clock operation of the gate clock signal GCKin mixes in the output terminal 49 during the period after time point t44, the output signal Q is drawn to the second low level. In addition, by the thin-film transistor TA going into an on state, the output signal G changes from the second low level to the first low level. During the period after time point t44, the same operation as that for a period after time point t24 of the above-described second embodiment (see FIG. 13) is performed.

Meanwhile, regarding after the gate output falls, timing at which the gate clock signal GCKin changes from the second low level to the high level next is the same as timing at which the potential at the second node N2 changes from the second low level to the high level. Hence, in the above-described second embodiment, there is a concern that when noise caused by the clock operation of the gate clock signal GCKin has occurred at time point t24 (see FIG. 13), the potential at the first node N1 is not drawn to the second low level and display failure occurs. In this regard, in the present variant, after the gate output falls, the second reset signal R2 is at the high level throughout a period before and after timing (time point t44 of FIG. 19) at which the gate clock signal GCKin changes from the second low level to the high level. Hence, since the thin-film transistor TD is maintained in an on state throughout the period before and after the timing at which the gate clock signal GCKin changes from the second low level to the high level, the potential at the first node N1 is securely maintained at the second low level regardless of the clock operation of the gate clock signal GCKin. By this, the occurrence of display failure is suppressed.

<2.4.3 Third Variant>

Figure 20:
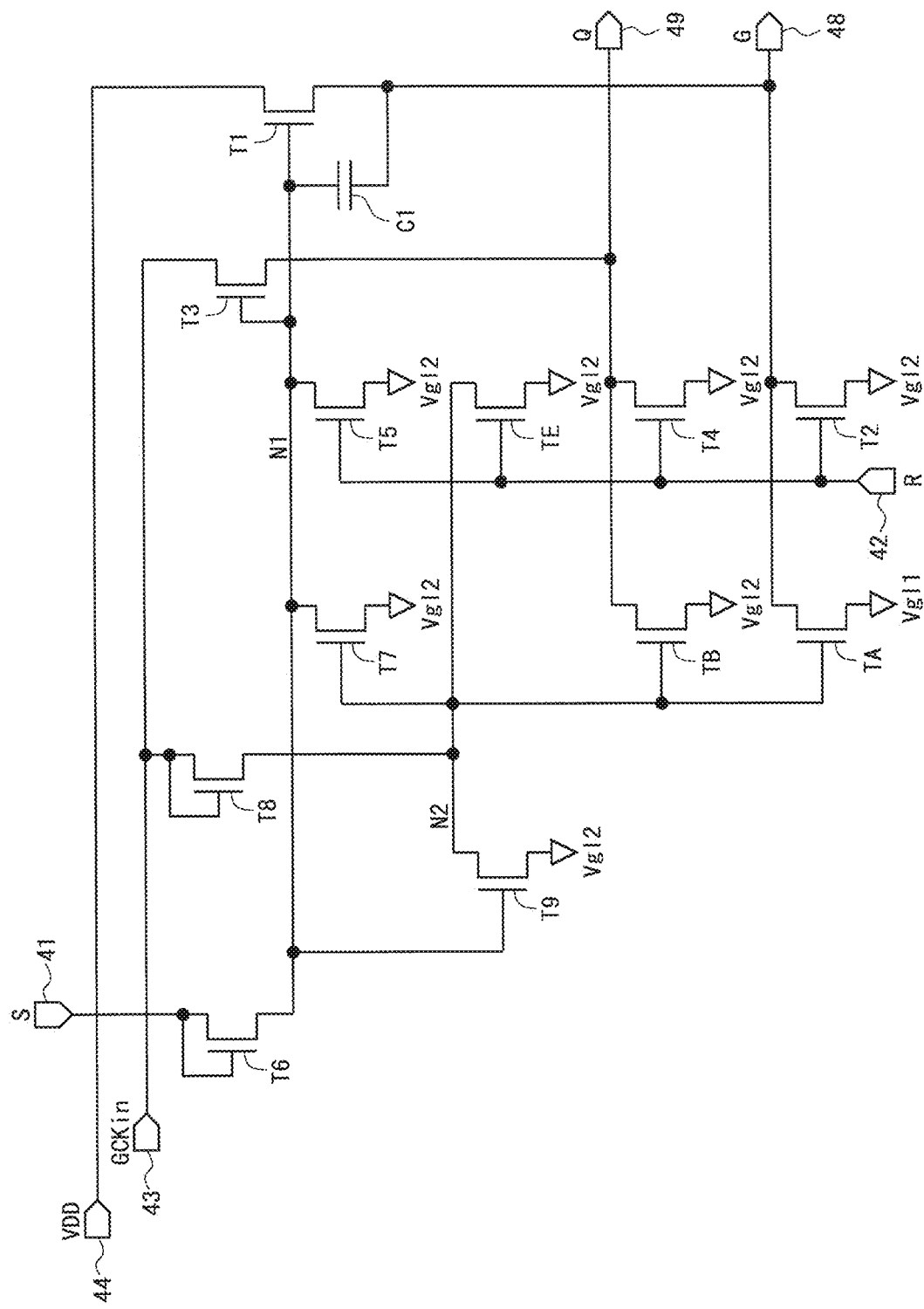
FIG. 20 is a circuit diagram showing a configuration of a unit circuit (a configuration of a portion of a shift register for one stage) in a third variant of the second embodiment.

FIG. 20 is a circuit diagram showing a configuration of a unit circuit 4(a configuration of a portion of the shift register 410 for one stage) of the present variant. In the present variant, in the unit circuit 4, there is provided a thin-film transistor TE in addition to the components of the above-described second embodiment. The thin-film transistor TE is connected at its gate terminal to the input terminal 42, connected at its drain terminal to the second node N2, and connected at its source terminal to the input terminal for the second gate low voltage Vgl2. The thin-film transistor TE changes the potential at the second node N2 toward the second low level when the reset signal R is at the high level. Note that a second-node stabilization transistor is implemented by the thin-film transistor TE.

According to the present variant, in the unit circuit 4, as a transistor for bringing the potential at the second node N2 to the second low level, there is provided the thin-film transistor TE in addition to the thin-film transistor T9. Here, there is a concern that if the potential at the second node N2 is unstable when the reset signal R has changed from the second low level to the high level, then the state of the thin-film transistor TA becomes unstable and a flow-through current occurs between the thin-film transistor T2 and the thin-film transistor TA. In this regard, according to the present variant, the potential at the second node N2 is securely maintained at the second low level throughout a period during which the reset signal R is at the high level (a period from time point t23 to t24 of FIG. 13). Hence, the occurrence of a flow-through current between the thin-film transistor T2 and the thin-film transistor TA is suppressed.

<3. Others>

Figure 21:
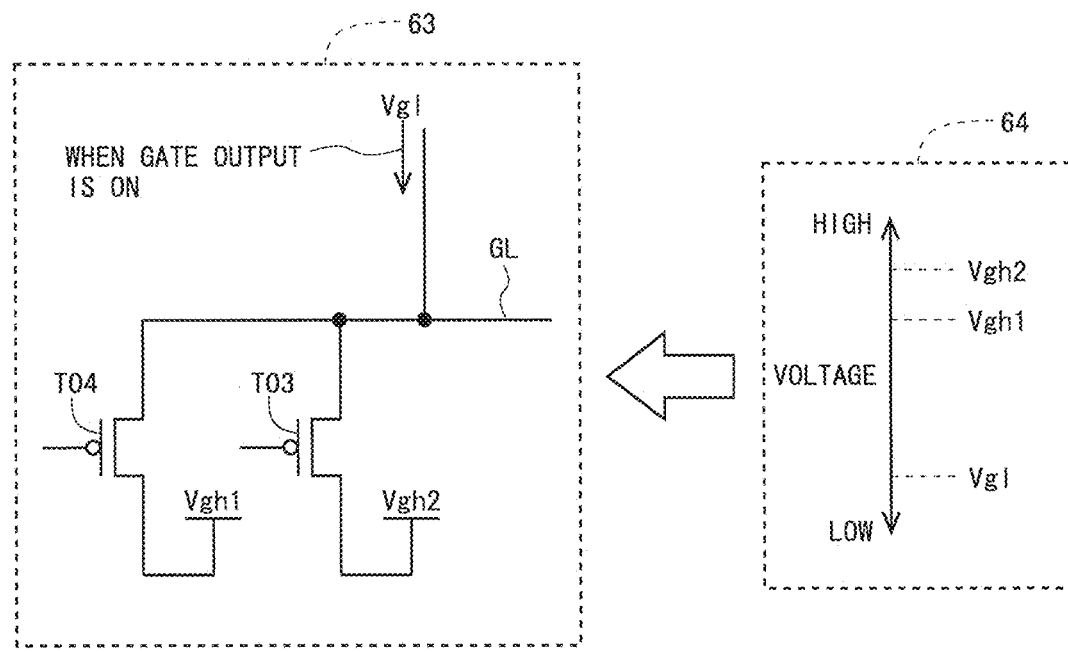
FIG. 21 is a diagram for describing a case of using p-channel thin-film transistors.
Figure 22:
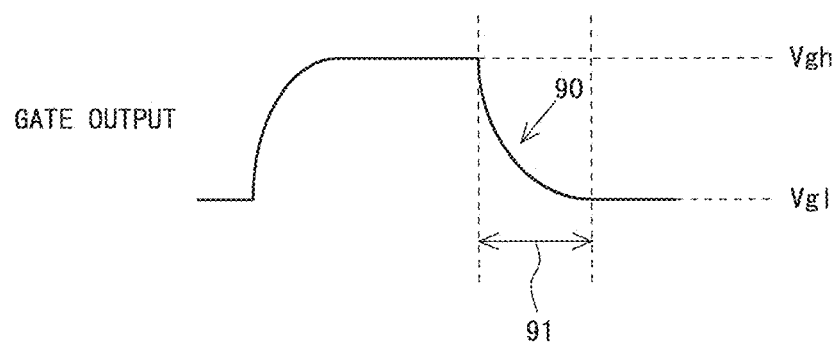
FIG. 22 is a diagram for describing conventional art.

The present invention is not limited to the above-described embodiments (including the variants), and can be implemented by making various modifications thereto without departing from the spirit and scope of the present invention. For example, although the description is made based on the premise that n-channel thin-film transistors are adopted in the above-described embodiments, p-channel thin-film transistors can also be adopted (see FIG. 21). Regarding this, in a case in which p-channel thin-film transistors are adopted, voltage polarities are all reversal from those of the above-described embodiments. In this case, in a portion near an output portion of the unit circuit, there are provided a gate-output rise transistor T03 which is a transistor for allowing a gate output to rise; and a gate-output stabilization transistor 104 which is a transistor for maintaining the gate output at a high level (off level) during a normal operating period (see the inside of a dashed-line box given reference character 63 in FIG. 21). Both the gate-output rise transistor T03 and the gate-output stabilization transistor 104 are connected at their drain terminals to a gate bus line GL. In addition, as a high-level direct-current power supply voltage for controlling the operation of the gate driver, there are prepared a first gate high voltage Vgh1 having a voltage level that is conventionally used to bring the pixel TFTs into an off state (bring the gate bus lines GL into a non-selected state), and a second gate high voltage Vgh2 having a higher voltage level than the first gate high voltage Vgh1 (see the inside of a dashed-line box given reference character 64 in FIG. 21). The first gate high voltage Vgh1 is provided to a source terminal of the gate-output stabilization transistor 104, and the second gate high voltage Vgh2 is provided to a source terminal of the gate-output rise transistor T03. In a configuration such as that described above, upon allowing the gate output to rise, first, the gate-output rise transistor T03 is brought into an on state, and then the gate-output stabilization transistor 104 is brought into an on state. By this, upon allowing the gate output to rise, the voltage of a scanning signal once increases to the voltage level of the second gate high voltage Vgh2, and then changes to the voltage level of the first gate high voltage Vgh1. In the above-described manner, even when p-channel thin-film transistors are adopted, the same effects as those of the above-described embodiments (including the variants) can be obtained.

Furthermore, regardless of the type of thin-film transistors to be used, it can be considered that a scanning signal line drive circuit including a shift register including a plurality of unit circuits may be configured as follows. At least a first non-selection level voltage and a second non-selection level voltage are provided to each unit circuit, as a non-selection level voltage having a voltage level that brings the scanning signal lines into a non-selected state. Each unit circuit includes a first output node that outputs a first output signal to be provided to a corresponding scanning signal line; a first-output-node stabilization transistor having a control terminal, a first conduction terminal connected to the first output node, and a second conduction terminal to which the first non-selection level voltage is provided; and a non-selection control transistor having a control terminal, a first conduction terminal connected to the first output node, and a second conduction terminal to which the second non-selection level voltage is provided. The plurality of unit circuits sequentially output, as the first output signals, selection level voltages having a voltage level that brings the scanning signal lines into a selected state, from the first output nodes. Here, a difference in voltage level between the selection level voltage and the second non-selection level voltage is made larger than a difference in voltage level between the selection level voltage and the first non-selection level voltage. In addition, in each unit circuit, upon changing a corresponding scanning signal line from a selected state to a non-selected state, the non-selection control transistor is brought into an on state and then the first-output-node stabilization transistor is brought into an on state.

In the configuration shown in FIG. 1 (the configuration using n-channel thin-film transistors), a voltage level indicated by reference character Vgh corresponds to the voltage level of the selection level voltage, a voltage level indicated by reference character Vgl1 corresponds to the voltage level of the first non-selection level voltage, and a voltage level indicated by reference character Vgl2 corresponds to the voltage level of the second non-selection level voltage. In addition, in the configuration shown in FIG. 21 (the configuration using p-channel thin-film transistors), a voltage level indicated by reference character Vgl corresponds to the voltage level of the selection level voltage, a voltage level indicated by reference character Vgh1 corresponds to the voltage level of the first non-selection level voltage, and a voltage level indicated by reference character Vgh2 corresponds to the voltage level of the second non-selection level voltage.

Note that it is preferred to use oxide semiconductor TFTs (e.g., IGZO-TFTs) as thin-film transistors in circuits included in liquid crystal display devices according to the above-described embodiments (including the variants) because effects such as low power consumption and a reduction in circuit area are obtained.

This application claims priority to Japanese Patent Application No. 2017-81030, entitled "Scanning Signal Line Drive Circuit And Display Device Equipped With Same", filed Apr. 17, 2017, the content of which is incorporated herein by reference.

DESCRIPTION OF REFERENCE CHARACTERS

4 and 4(1) to 4(*i*): UNIT CIRCUIT
400: GATE DRIVER (SCANNING SIGNAL LINE DRIVE CIRCUIT)
410: SHIFT REGISTER
GL and GL(1) to GL(i): GATE BUS LINE
T1 to T9 and TA to TE: THIN-FILM TRANSISTOR IN UNIT CIRCUIT
GCK, GCKin, and GCK1 to GCK8: GATE CLOCK SIGNAL
GOUT and GOUT(1) to GOUT(i): SCANNING SIGNAL
G and Q: OUTPUT SIGNAL (FROM UNIT CIRCUIT)
S: SET SIGNAL
R: RESET SIGNAL
VDD: HIGH-LEVEL DIRECT-CURRENT POWER SUPPLY VOLTAGE
Vgh: GATE HIGH VOLTAGE
Vgl1: FIRST GATE LOW VOLTAGE
Vgl2: SECOND GATE LOW VOLTAGE

The invention claimed is:

1. A scanning signal line drive circuit to drive a plurality of scanning signal lines arranged in a display of a display device, the scanning signal line drive circuit including a shift register including a plurality of unit circuits configured to operate based on a plurality of clock signals, wherein
at least a first non-selection level voltage and a second non-selection level voltage are provided to each unit circuit, as a non-selection level voltage having a voltage level that brings the scanning signal lines into a non-selected state,
each unit circuit includes:
a first output node configured to output a first output signal to be provided to a corresponding scanning signal line;
a first-output-node stabilization transistor having a control terminal, a first conduction terminal connected to the first output node, and a second conduction terminal to which the first non-selection level voltage is provided;
a non-selection control transistor having a control terminal, a first conduction terminal connected to the first output node, and a second conduction terminal to which the second non-selection level voltage is provided; and
a second output node configured to output a second output signal to control operation of a different shift register,
the plurality of unit circuits sequentially output, as the first output signal, selection level voltages having a voltage level that brings the scanning signal lines into a selected state, from the first output node,
a difference in voltage level between the selection level voltage and the second non-selection level voltage is larger than a difference in voltage level between the selection level voltage and the first non-selection level voltage, and
in each unit circuit, upon changing a corresponding scanning signal line from a selected state to a non-selected state, the non-selection control transistor is brought into an on state and then the first-output-node stabilization transistor is brought into an on state.

2. The scanning signal line drive circuit according to claim 1, wherein each unit circuit further includes:
a selection control transistor having a control terminal, a first conduction terminal to which the selection level voltage is provided continuously or every predetermined period, and a second conduction terminal connected to the first output node;
a first node connected to the control terminal of the selection control transistor;
a first-node turn-on transistor configured to change a potential at the first node toward an on level, based on a set signal provided from a unit circuit of a preceding stage; and
a first-node turn-off transistor configured to change the potential at the first node toward an off level, based on a reset signal provided from a unit circuit of a subsequent stage.

3. The scanning signal line drive circuit according to claim 2, wherein each unit circuit further includes:
a second output node configured to output a second output signal for controlling operation of another unit circuit;
an output control transistor having a control terminal connected to the first node, a first conduction terminal to which one of the plurality of clock signals is provided, and a second conduction terminal connected to the second output node;
a non-output control transistor having a control terminal to which the reset signal is provided, a first conduction terminal connected to the second output node, and a second conduction terminal to which the non-selection level voltage is provided;
a first first-node stabilization transistor having a control terminal, a first conduction terminal connected to the first node, and a second conduction terminal to which the non-selection level voltage is provided;
a second node connected to the control terminal of the first first-node stabilization transistor;
second-node turn-on transistor configured to maintain a potential at the second node at an on level during a period during which the potential at the first node is to be maintained at an off level;

a second-node turn-off transistor having a control terminal connected to the first node, a first conduction terminal connected to the second node, and a second conduction terminal to which the non-selection level voltage is provided; and a second-output-node stabilization transistor having a control terminal connected to the second node, a first conduction terminal connected to the second output node, and a second conduction terminal to which the non-selection level voltage is provided, to each unit circuit, the second output signal outputted from the second output node of a unit circuit of a preceding stage is provided as the set signal, to each unit circuit, the second output signal outputted from the second output node of a unit circuit of a subsequent stage is provided as the reset signal, the control terminal of the first-output-node stabilization transistor is connected to the second node, the reset signal is provided to the control terminal of the non-selection control transistor, and the first-node turn-off transistor has a control terminal to which the reset signal is provided, a first conduction terminal connected to the first node, and a second conduction terminal to which the non-selection level voltage is provided.

4. The scanning signal line drive circuit according to claim 3, wherein one of the plurality of clock signals that is same as a clock signal provided to the first conduction terminal of the output control transistor is provided to the first conduction terminal of the selection control transistor, and voltage levels of the plurality of clock signals change between the voltage level of the selection level voltage and the voltage level of the non-selection level voltage.

5. The scanning signal line drive circuit according to claim 3, wherein a direct-current voltage is provided as the selection level voltage to the first conduction terminal of the selection control transistor.

6. The scanning signal line drive circuit according to claim 5, wherein each unit circuit further includes a second-node initial charging transistor configured to change the potential at the second node toward an on level, based on a start pulse signal instructing to start shift operation of the shift register.

7. The scanning signal line drive circuit according to claim 5, wherein voltage levels of the plurality of clock signals change between the voltage level of the selection level voltage and the voltage level of the non-selection level voltage, and each unit circuit further includes a second first-node stabilization transistor having a control terminal to which one of second output signals outputted from second output nodes of unit circuits of subsequent stages is provided, the one of second output signals being maintained at an on level when the potential at the second node changes from an off level to an on level by a change in a voltage level of a clock signal that is provided to the first conduction terminal of the output control transistor to the voltage level of the selection level voltage; a first conduction terminal connected to the first node; and a second conduction terminal to which the non-selection level voltage is provided.

8. The scanning signal line drive circuit according to claim 5, wherein each unit circuit further includes a second-node stabilization transistor having a control terminal to which the reset signal is provided, a first conduction terminal connected to the second node, and a second conduction terminal to which the non-selection level voltage is provided.

9. The scanning signal line drive circuit according to claim 1, wherein the first-output-node stabilization transistor and the non-selection control transistor are n-channel thin-film transistors, the voltage level of the selection level voltage is higher than the voltage level of the first non-selection level voltage, and the voltage level of the first non-selection level voltage is higher than the voltage level of the second non-selection level voltage.

10. A display device comprising a scanning signal line drive circuit according to claim 1.

* * * * *